US006931618B1

(12) United States Patent
Tabery et al.

(10) Patent No.: US 6,931,618 B1
(45) Date of Patent: Aug. 16, 2005

(54) FEED FORWARD PROCESS CONTROL USING SCATTEROMETRY FOR RETICLE FABRICATION

(75) Inventors: Cyrus E. Tabery, Cupertino, CA (US); Bharath Rangarajan, Santa Clara, CA (US); Bhanwar Singh, Morgan Hill, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 498 days.

(21) Appl. No.: 10/050,472

(22) Filed: Jan. 16, 2002

(51) Int. Cl.[7] .......................... G06F 17/50; G01B 9/00; G03H 9/00
(52) U.S. Cl. .......................... 716/19; 716/20; 356/124; 430/5
(58) Field of Search .................. 716/19–21; 702/40; 700/89, 96, 121; 430/5; 356/124–127

(56) References Cited

U.S. PATENT DOCUMENTS

| | | | |
|---|---|---|---|
| 4,218,142 A * | 8/1980 | Kryger et al. ............... 356/394 |
| 5,912,741 A * | 6/1999 | Carter et al. ................ 356/445 |
| 6,099,992 A | 8/2000 | Motoyama et al. ............ 430/5 |
| 6,130,012 A | 10/2000 | May et al. ..................... 430/5 |
| 6,183,915 B1 | 2/2001 | Rolfson ........................ 430/5 |
| 6,194,105 B1 | 2/2001 | Shacham et al. .............. 430/5 |
| 6,238,824 B1 | 5/2001 | Futrell et al. .................. 430/5 |
| 6,429,930 B1 * | 8/2002 | Littau et al. ................. 356/124 |
| 6,606,152 B2 * | 8/2003 | Littau et al. ................. 356/124 |
| 6,809,824 B1 * | 10/2004 | Yates et al. .................. 356/400 |

* cited by examiner

Primary Examiner—Stacy A. Whitmore
Assistant Examiner—Magid Y. Dimyan
(74) Attorney, Agent, or Firm—Amin & Turocy, LLP

(57) ABSTRACT

A system for selectively generating and feeding forward reticle fabrication data is provided. The system includes components for fabricating a reticle and a control system operatively connected to the fabricating components, where the control system can control the operation of the fabricating components. The control system bases its control of the fabricating components, at least in part, on feed forward control information generated by a processor that analyzes scatterometry based reticle fabrication data gathered from measurement components. The scatterometry data is compared to data stored in a signature data store that facilitates analyzing gathered scatterometry signatures to produce feed forward control information that can be employed to manipulate subsequent reticle fabrication processes and/or apparatus.

10 Claims, 21 Drawing Sheets

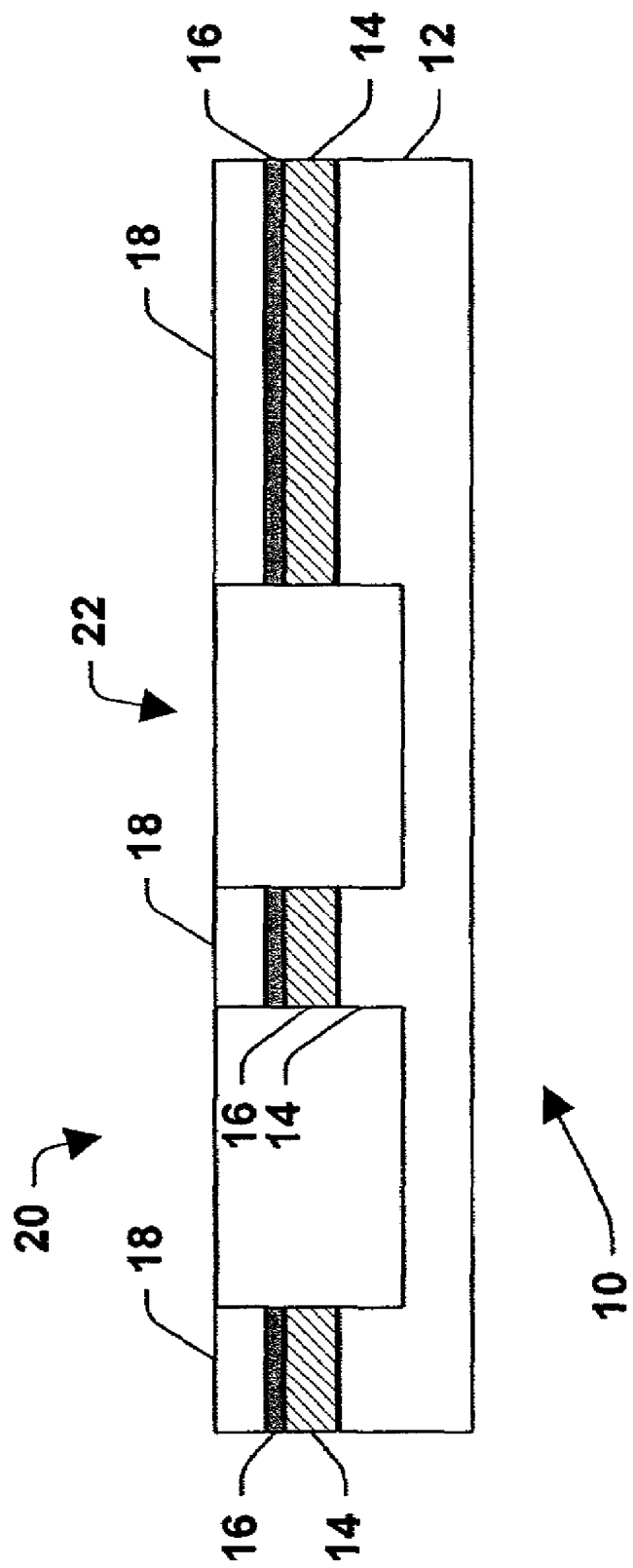

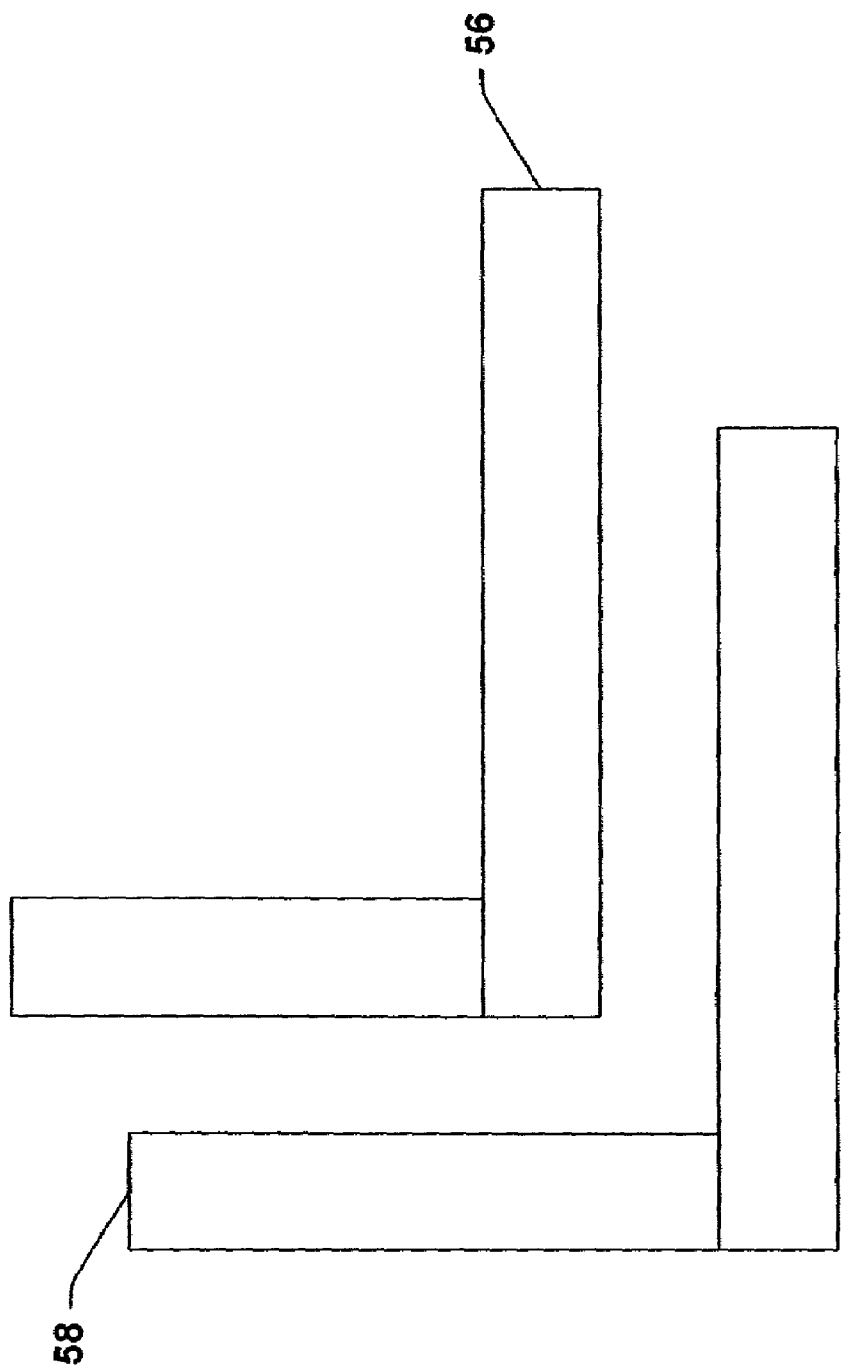

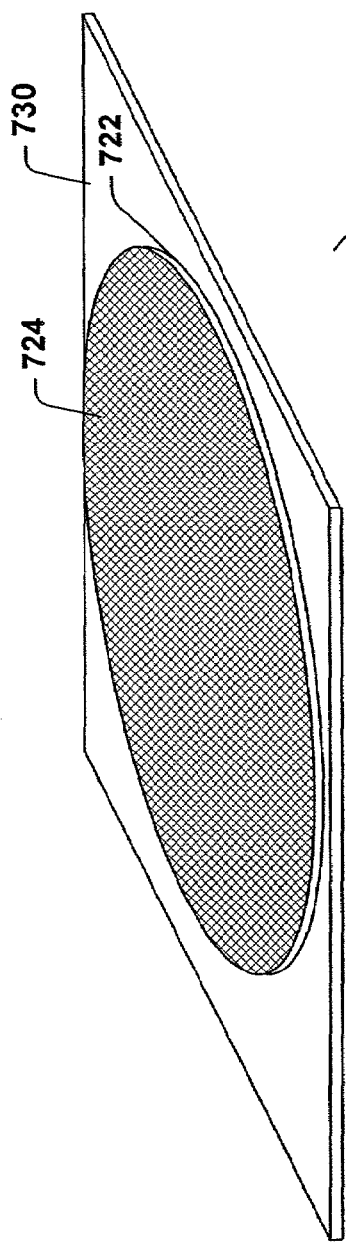
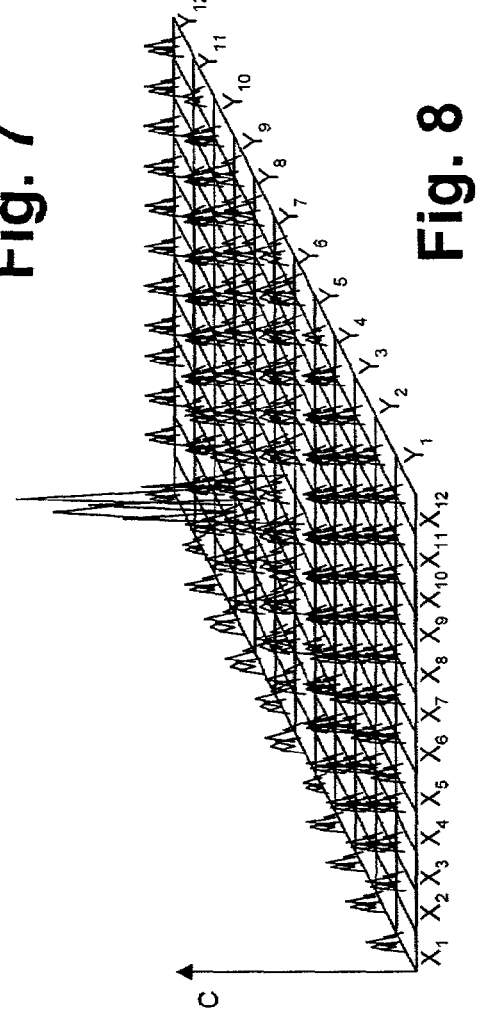
Fig. 7
Fig. 8
Fig. 9

FEED FORWARD PROCESS CONTROL USING SCATTEROMETRY FOR RETICLE FABRICATION

TECHNICAL FIELD

The present invention generally relates to semiconductor processing, and in particular to a system and method for feeding forward reticle fabrication data to facilitate controlling downstream processes and/or apparatus employed in reticle fabrication.

BACKGROUND

In the semiconductor industry, there is a continuing trend toward higher device densities. To achieve these high densities there have been, and continue to be, efforts toward scaling down device dimensions (e.g., at sub-micron levels) on semiconductor wafers. In order to accomplish such high device packing densities, smaller and smaller features sizes are required. This may include the width and spacing of interconnecting lines, spacing and diameter of contact holes, and the surface geometry, such as corners and edges, of various features. The dimensions of and between such small features can be referred to as critical dimensions (CDs). Reducing CDs, and reproducing more accurate CDs facilitates achieving such higher device densities. Conventional lithographic processes employed to produce such features depend, at least in part, on the quality of reticles employed in fabricating the integrated circuits. Thus, improvements in reticle fabrication quality are desired.

Reticle manufacture can involve phases including, but not limited to depositing a photoresist on a reticle, exposing a pattern into the photoresist, post exposure baking, developing the pattern exposed into the photoresist, etching the photoresist and/or mask and stripping the resist. Conventionally, metrology associated with each phase has been handled independently, which results in missed opportunities for improved process control.

By way of illustration, a photoresist application process employed in manufacturing a reticle may rely on preprogrammed times, temperatures, formulae, etc., to deposit photoresist on a reticle. The photoresist application process may be monitored to facilitate determining when a desired application has occurred, but such information gathered during this phase is typically employed only during this phase. Thus, opportunities to improve downstream processes are lost.

By way of further illustration, a subsequent reticle manufacture phase, (e.g., post exposure bake, development) may similarly apply pre-programmed times, temperatures, formulae etc. that are based on historical performance, where the times, temperatures, formulae and the like may have to account for deviations in previous reticle fabrication steps.

By way of still further illustration, conventional etch processes have either lacked control systems, requiring pre-calculated etching steps, or have had indirect control, which is based on indirect information (e.g., amount of gas generated by plasma gas discharge etching). Such pre-determined calculations and/or indirect feedback control do not provide adequate monitoring and thus do not facilitate precise control over the etch process. Furthermore, such pre-determined calculations and/or indirect feedback control do not account for variations produced in previous reticle fabrication phases. Monitoring tools employed in conjunction with feed back control are known in the art and provide improvements over time based control. But such feed back systems suffer from operating in isolation.

The process of manufacturing semiconductors (e.g., integrated circuits, ICs, chips) employing reticles typically consists of more than a hundred steps, during which hundreds of copies of an integrated circuit may be formed on a single wafer. Generally, the process involves creating several patterned layers on and into the substrate that ultimately forms the complete integrated circuit. The patterned layers are created, in part, by the light that passes through the reticles. Thus, processing the positive or negative of the pattern into the reticle is important in fabricating the chips.

Unfortunately, commonly used fabrication systems check reticle CDs near or at the end of fabrication, or at pre-scheduled time intervals. These types of end-point and interval detection methods can be problematic for several reasons. For example, at late stages in the fabrication process, the presence of at least one mal-formed portion may render the reticle unusable, forcing it to be discarded. In addition, post-fabrication detection/quality control data does not provide a user with real-time information related to the reticle being fabricated. Post-fabrication data may only allow an estimation or a projection as to what adjustments are needed to correct the fabrication errors and/or flaws. Such estimations and/or projections concerning necessary adjustments may lead to continued or recurring fabrication errors. Moreover, such a lengthy adjustment process may cause subsequently fabricated reticles to be wasted in the hopes of mitigating etch process errors.

Visual inspection methods have been important in both production and development of reticles. For example, visually inspecting developed photoresist patterns from a dose-focus matrix is well-known in the art. While visual inspection techniques may be simple to implement, they are difficult to automate, and furthermore, have typically operated in isolation from other fabrication phases. Further, visual techniques employing scanning electron microscopes (SEM) and atomic force microscopes (AFM) can be expensive, time-consuming and/or destructive.

SUMMARY OF THE INVENTION

The following presents a simplified summary of the invention in order to provide a basic understanding of some aspects of the invention. This summary is not an extensive overview of the invention. It is not intended to identify key or critical elements of the invention or to delineate the scope of the invention. Its sole purpose is to present some concepts of the invention in a simplified form as a prelude to the more detailed description presented later.

The present invention provides a system that facilitates feeding forward reticle fabrication data to improve subsequent (e.g., downstream) reticle fabrication processes. An exemplary system may employ one or more light sources arranged to project light onto a reticle during one or more reticle fabrication phases. The reticle may include layers, features and/or gratings, for example, onto which a light may be directed. The system includes light sensing devices (e.g., photo detector, photodiode) for detecting light reflected and/or refracted by the one or more layers, features and/or gratings during the one or more reticle fabrication phases. The light reflected from the one or more layers, features and/or gratings is indicative of at least one parameter of the reticle fabrication process and can be employed to adapt subsequent reticle fabrication phases. For example, data gathered after a post exposure bake (PEB) phase can be employed in a subsequent development phase. By way of illustration, data gathered concerning the thickness of a photoresist layer applied during a photoresist deposition phase can be employed to help determine a more optimal development time. Thus, rather than a conventional development time based on a historical norm that had to account for a range of variations in a previous deposition phase, a development time can be based on data gathered concerning the reticle currently being fabricated. By way of further illustration, data gathered after a development phase can be employed in a subsequent etch phase to determine etch parameters including, but not limited to, time, temperature, angle, formulae, and the like. Rather than a conventional etch step employing historical data to establish etch parameters, a system operated in accordance with the present invention can employ data gathered from the actual reticle being manufactured, which facilitates tightening reticle manufacturing tolerances and thus improving reticle quality.

In accordance with an aspect of the present invention, a system for feeding forward reticle fabrication data is provided. The system includes fabricating components that perform reticle fabrication processes and a control system that controls the fabricating components based on scatterometry based measurements received from measurement components. The system also includes a signature data store that stores one or more scatterometry signatures that can be employed to facilitate producing the feed forward control data.

Another aspect of the present invention provides a system for feeding forward reticle fabrication data that includes fabricating components adapted to perform reticle fabrication processes and a fabricating component driving system that can drive the one or more fabricating components. The system also includes a system for directing light on to a reticle, a measuring system for measuring light reflected and/or refracted from the reticle and a processor operatively coupled to the measuring system and the fabricating component driving system, where the processor generates feed forward control data adapted to selectively control the fabricating components via the fabrication component driving system.

Yet another aspect of the present invention provides a method for feeding forward reticle fabrication control information. The method includes performing a reticle fabrication step, gathering scatterometry based reticle fabrication data concerning the reticle fabrication performed during the reticle fabrication step, determining whether there is a subsequent reticle fabrication process and/or apparatus that can benefit from receiving feed forward control information based on the reticle fabrication data and if there is such a subsequent reticle fabrication process and/or apparatus, selectively generating feed forward control information based on the reticle fabrication data, and selectively forwarding the feed forward control information to the subsequent reticle fabrication processes and/or apparatus.

Still yet another aspect of the present invention provides a system for feeding forward reticle fabrication control data. The system includes means for fabricating a reticle, means for sensing reticle fabrication parameters via scatterometry and means for selectively generating and feeding forward reticle fabrication control data operable to facilitate adapting the means for fabricating a reticle.

To the accomplishment of the foregoing and related ends, the invention, then, comprises the features hereinafter fully described and particularly pointed out in the claims. The following description and the drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The present invention is illustrated by way of example in the accompanying figures.

FIG. 1C is a view of the FIG. 1A blank at a subsequent reticle fabrication step.

FIG. 1F is a highly magnified plan view of a selected portion of FIG. 1E.

FIG. 7 is a perspective illustration of a reticle that may be fabricated in accordance with an aspect of the present invention.

FIG. 8 is a representative three-dimensional grid map of a reticle illustrating measurements taken at grid blocks of the reticle in accordance with an aspect of the present invention.

FIG. 9 is a signature measurement table correlating the measurements of FIG. 8 with desired values for the measurements in accordance with the present invention.

DETAILED DESCRIPTION

Figure 1:
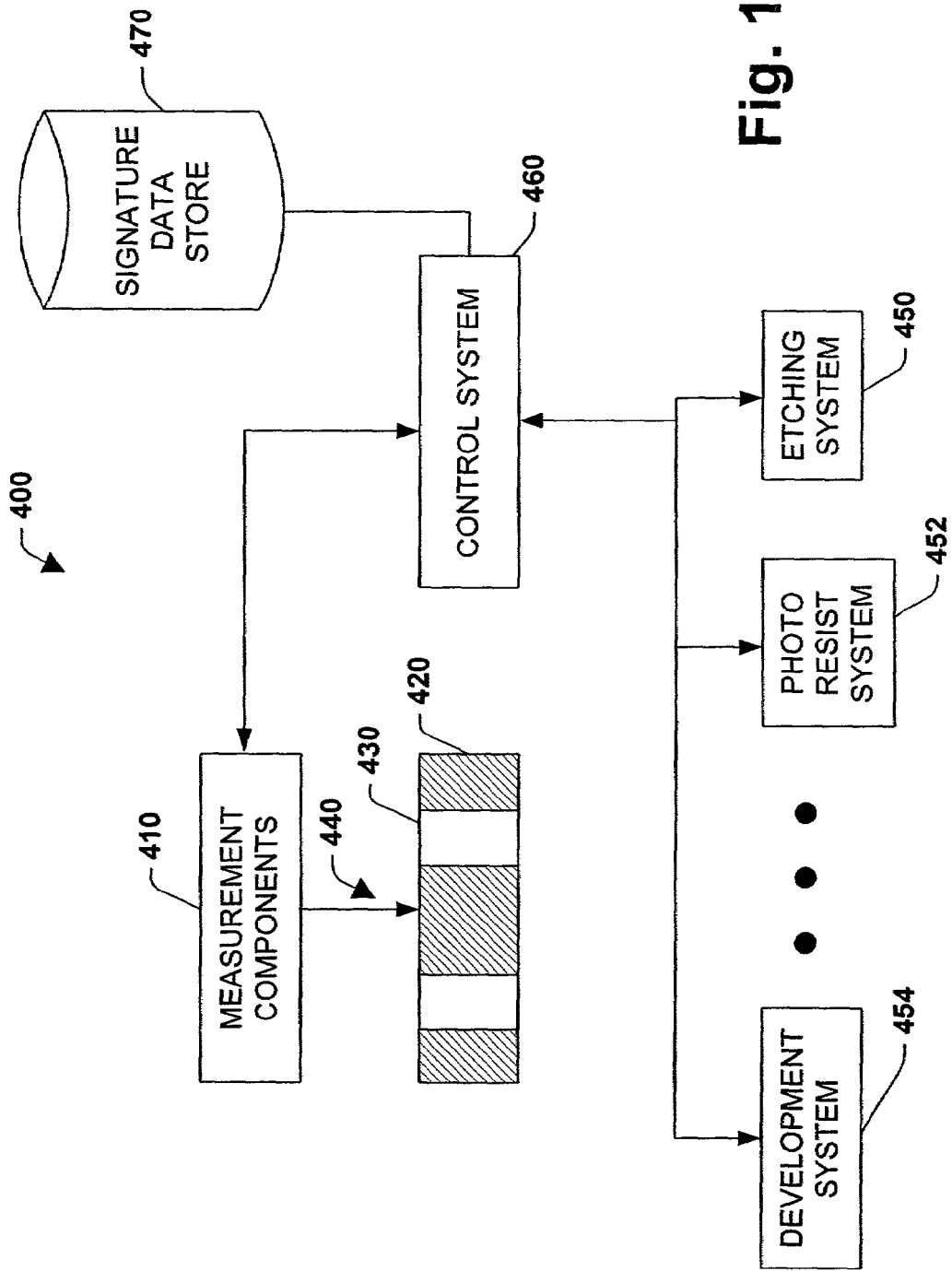
FIG. 1 is a simplified block diagram of a feed-forward reticle fabrication system, in accordance with an aspect of the present invention.

The present invention will now be described with reference to the drawings, where like reference numerals are used to refer to like elements throughout. The following detailed description is of the best modes presently contemplated by the inventors for practicing the invention. It should be understood that the description of these aspects are merely illustrative and that they should not be taken in a limiting sense.

Referring initially to FIG. 1, a block diagram of a system 400 that feeds forward reticle fabrication data is illustrated. During reticle fabrication, a reticle 420 can be operated on by a variety of reticle fabrication components (e.g., an etching system 450, a photoresist application system 452, a development system 454, etc.). While three such systems are illustrated, it is to be appreciated that a greater and/or lesser number of such systems may be employed in accordance with the present invention.

By way of illustration and not limitation, the mask etching system 450 may be able to etch apertures 430 of various shapes, depths, profiles and widths in the reticle 420. Information gathered during and/or after the fabrication of the apertures 430 in the reticle 420 may be fed forward to subsequent reticle fabrication processes and/or apparatus. Feeding forward data from previous fabrication phases to subsequent fabrication phases facilitates providing more precise starting parameters for such subsequent fabrication phases and thus facilitates fabricating higher quality reticles.

By way of illustration, a development system 454 may be employed in fabricating the reticle 420. Data associated with processing performed by the development system 454 may be fed forward, for example, to the etching system 450, which facilitates more precisely controlling an etch process performed by the etching system 450. For example, during fabrication of a first reticle, analysis of data associated with the development system 454 may indicate that a photoresist layer of a first width has been developed. Thus, rather than the etching system 450 relying on, for example, historical ranges of photoresist layer depth, the etching system 450 may rely on the actual data associated with the reticle being fabricated. Thus, more individualized control is possible, which results in higher quality reticles.

The system 400 also includes one or more measurement components 410 operable to measure CDs during reticle fabrication phases. The measurement components 410 include, for example, a light source that emits a beam 440 incident to the surface of the reticle 420. The beam 440 interacts with the reticle 420 and, for example, apertures 430 in the reticle 420 and thus is reflected and/or diffracted. The measurement components 410 also include a detection system for detecting the reflected and/or diffracted light (also indicated as 440 for purposes of brevity). The detection system may include, for example, one or more photo diodes and/or photo detectors. Characteristics (e.g. shape, depth, width) of the apertures 430, for example, are determined based on the properties of the reflected and/or diffracted light 440. The system 400 also includes a control system 460 operatively coupled to the fabrication systems and the measurement components 410. The control system 460 is programmed and/or configured to control operation of one or more of the fabrication systems (e.g., etching system 450, photo resist system 452, development system 454) based, at least in part, on scatterometry measurement data gathered from the measurement components 410.

It is to be appreciated that the surface of the reticle 420, which may include features on and/or in the reticle 420 being processed, can both reflect and refract the light 440, so that the resulting light 440 can be a complex reflected and/or refracted light. It is to be further appreciated that although the light 440 is illustrated being directed at one side of the reticle 420, that the light 440 may be directed at either and/or both sides of the reticle 420. The scatterometry and/or reflectometry analysis can include comparing one or more scatterometry and/or reflectometry signatures associated with the reflected light 440 to one or more scatterometry and/or reflectometry signatures stored in a signature data store 470. Such signatures may be generated, for example, by combining phase, polarization and/or intensity information associated with the reflected light.

As fabrication progresses, light reflecting from the reticle 420 may produce various signatures. The sequence in which such signatures are generated can be analyzed to determine the rate at which fabrication is progressing and also to predict times when fabrication may be substantially completed and/or times when an ex-situ quality control analysis may be appropriate. Furthermore, such a sequence of signatures may be employed to predict, for example, when subsequent processes are to be scheduled. For example, at a first point in time T1, light reflected from the reticle 420 may produce a signature S1 that indicates that openings (e.g., aperture 430) with a first width W1, depth D1 and slope angles SA1 have been produced and that a test grating should be probed at a second point in time T2 and a third point in time T3 and that it is likely that the next reticle fabrication phase will begin at a time T4. Thus, at the second point in time T2, light reflected from the reticle 420 may produce a signature S2 that indicates that openings with a second width W2, depth D2 and slope angles SA2 have been produced and at a third point in time T3, light reflected from the reticle 420 may produce a signature S3 that indicates that lines with a third width W3, depth D3 and slope angles SA3 have been produced. Furthermore, equipment required for the subsequent reticle fabrication phase may be scheduled for T4.

Analyzing the sequence of signatures, and the time required to produce transitions between such signatures can facilitate determining whether fabrication is progressing at an acceptable rate, can facilitate predicting optimal times to pause a fabrication process to probe the fabrication process and can facilitate determining when fabrication should be terminated. Feedback information can be generated from such sequence analysis to maintain, increase and/or decrease the rate at which fabrication processes (e.g., etching) progresses. For example, one or more photoresist formulae and/or concentrations can be altered to affect the etching rate based on the signature sequence analysis. Feed forward information can be generated to facilitate configuring subsequent fabrication phases. For example, feed forward control data employed in apparatus scheduling and/or initialization may be generated and fed forward to one or more processes and/or apparatus.

The signature data can be stored in data structures including, but not limited to one or more lists, arrays, tables, databases, stacks, heaps, linked lists and data cubes. The signature data store 470 can reside on one physical device and/or may be distributed between two or more physical devices (e.g., disk drives, tape drives, memory units). Analyses associated with the reflected light and/or the signatures stored in the signature data store 470 can be employed to control one or more fabrication parameters (e.g., formula, concentration, time, angle) and in the present invention can be employed to terminate and/or pause fabrication, for example.

FIGS. 1A through 1F illustrate various reticle fabrication phases. Processes and/or apparatus that are employed in such reticle fabrication phases may benefit from having control data fed forward. For example, an etching phase may benefit from having actual data from the reticle being manufactured as opposed to a conventional etching system that may employ a historical range of values to initialize such an etching process.

Figure 1A:
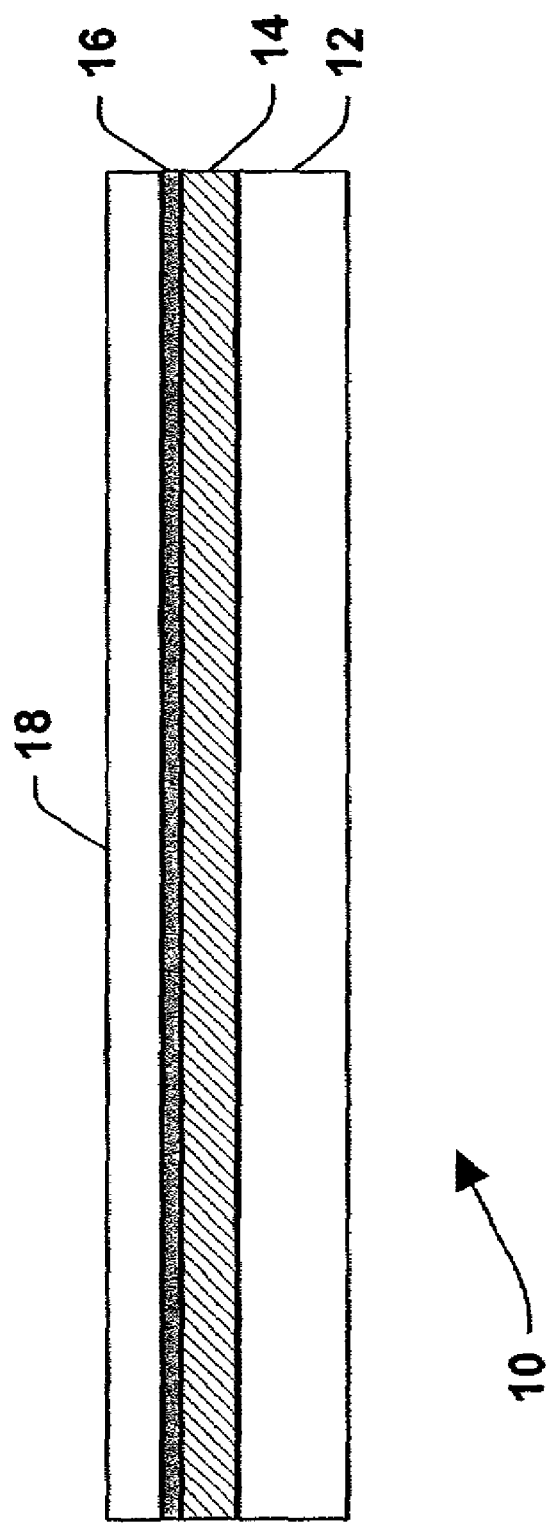
FIG. 1A is a diagrammatic sectional view of a reticle blank at a first reticle fabrication step.

Referring now to FIG. 1A, a reticle substrate 10 is illustrated. The substrate 10 comprises a light transmissive material 12 (e.g., quartz), and a light restricting material 14. Material 14 is ideally opaque to at least 99% transmission of light to be used in subsequent photoprocessing of semiconductor materials, and light transmissive material 12 is preferably transparent to at least 99% light transmission of the same light. An example material for layer 14 is a highly reflective material, such as chromium deposited to an example thickness of 800 Angstroms. An antireflective material 16 is formed over the light restricting material 14. Such antireflective layer 16 may or may not be opaque, with chromium oxide deposited to an example thickness of 200 Angstroms being one example material. An example process for forming layers 14 and 16 is physical vapor deposition from an elemental or alloy chromium source/target, whereby oxygen is introduced into the processing chamber to form the last 200 Angstroms in the form of a chromium oxide that functions as an antireflective coating. Scatterometry data collected from the vapor deposition phase may be employed to generate feed forward data that can be employed to initialize a subsequent resist deposition phase, for example. A photosensitive resist layer 18 is deposited over antireflective material 16 and light restrictive material 14. Layer 18 may constitute a negative or a positive photoresist, with a positive photoresist being utilized in this example. Process parameters associated with depositing the layer 18 may depend, at least in part, on process control data fed forward from a previous reticle fabrication process.

Figure 1B:
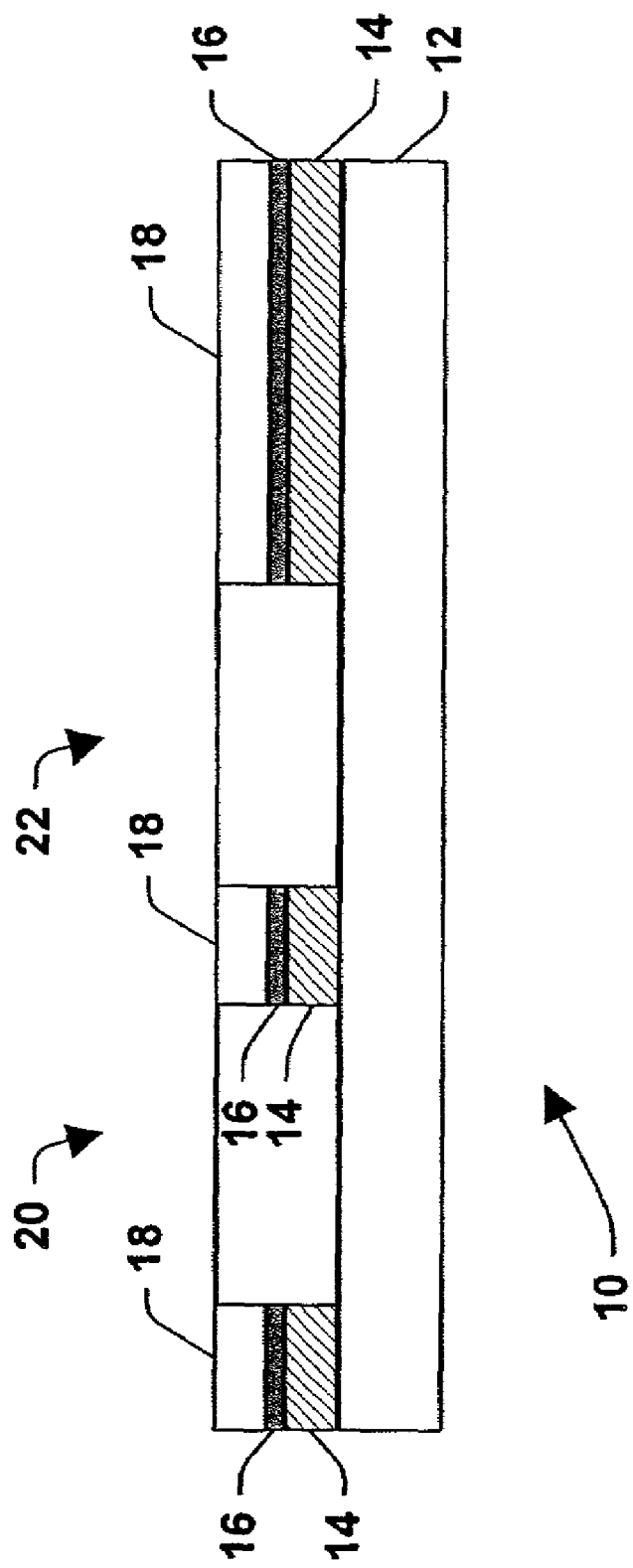
FIG. 1B is a view of the FIG. 1A blank at a subsequent reticle fabrication step.

Referring to FIG. 1B, openings 20 and 22 have been patterned through the resist layer 18 and into the light restricting material 14. As depicted, such openings are formed through the antireflective material 16 and through the light restricting material 14 to light transmissive material 12. The openings 20 and 22 may be processed, for example, by initially photo exposing resist layer 18 and developing the layer 18, followed by wet or dry etching of layers 16 and 14. Scatterometry data gathered from such processes may be employed to generate feed forward data that can thus be employed for etching, whose results are illustrated in FIG. 1C.

Referring to FIG. 1C, etching is conducted of the light transmissive material 12 through openings 20 and 22 while at least some of the resist layer remains over the antireflective material 16 and light restricting material 14. Depressions 24 are formed relative to the original outer surface of substrate/material 12. Etching of material 12 is conducted regardless of whether the depressions 24 are formed. Thus, minor etching in the form of surface roughening may be conducted or achieved relative to material 12 without forming the depressions 24. More precise control of the etching may be achieved as compared to conventional systems if the feed forward control information provided from previous reticle fabrication stages was employed, for example, to select an etch time for the etching based on an actual measurement, rather than on a historical range.

Figure 1D:
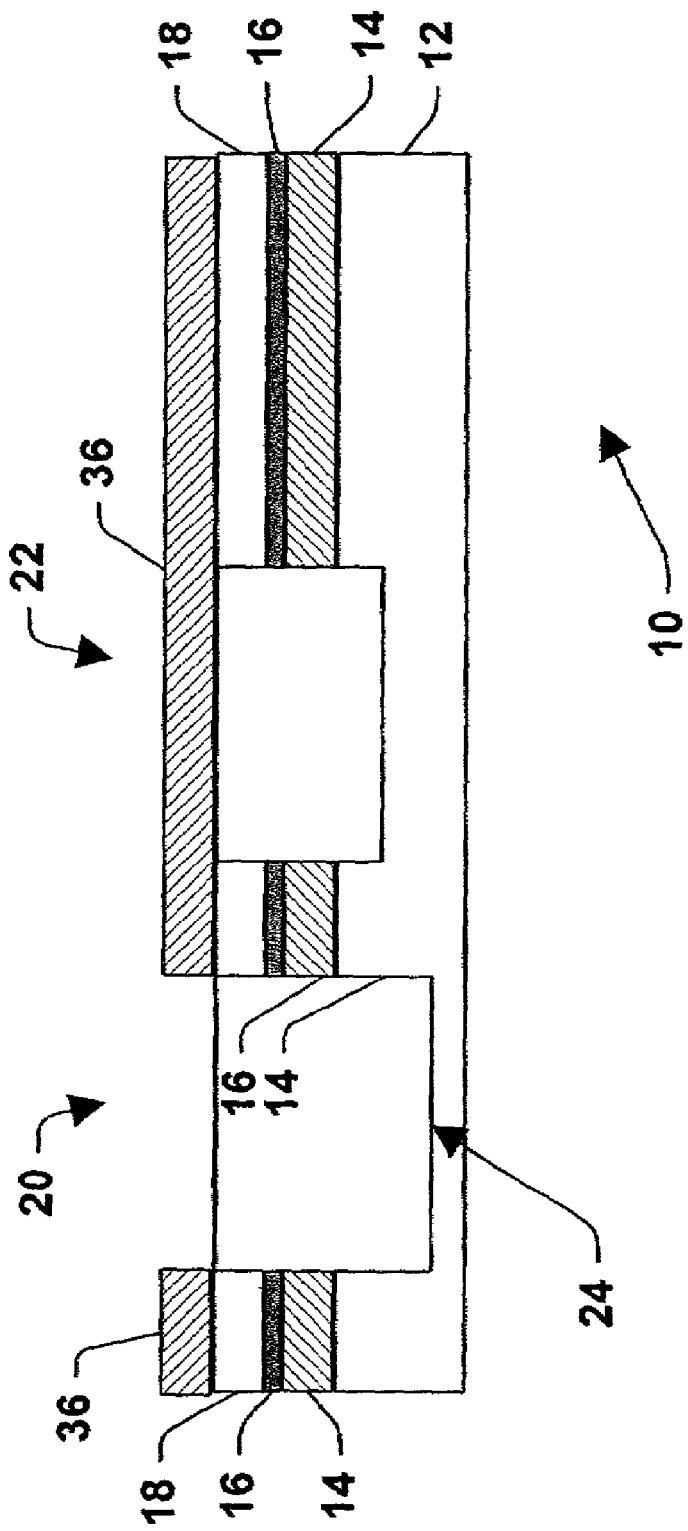
FIG. 1D is a view of the FIG. 1A blank at a subsequent reticle fabrication step.

Referring to FIG. 1D, substantially all of the resist layer 18 has been removed from over the antireflective material 16 and light reflective material 14. Another layer 36 of photosensitive resist, for example a different resist than the first resist material employed, is formed over the substrate to mask substantially all of the antireflective coating material 16 within the light restricting areas within the mask pattern. Such masking effectively also masks only some light transmissive areas over the substrate. For example, in the section of the substrate illustrated, light transmissive area 20 is unmasked while light transmissive area 22 is masked. Etching is then conducted of exposed light transmissive material, thus forming, for example, a phase shifted area.

Figure 1E:
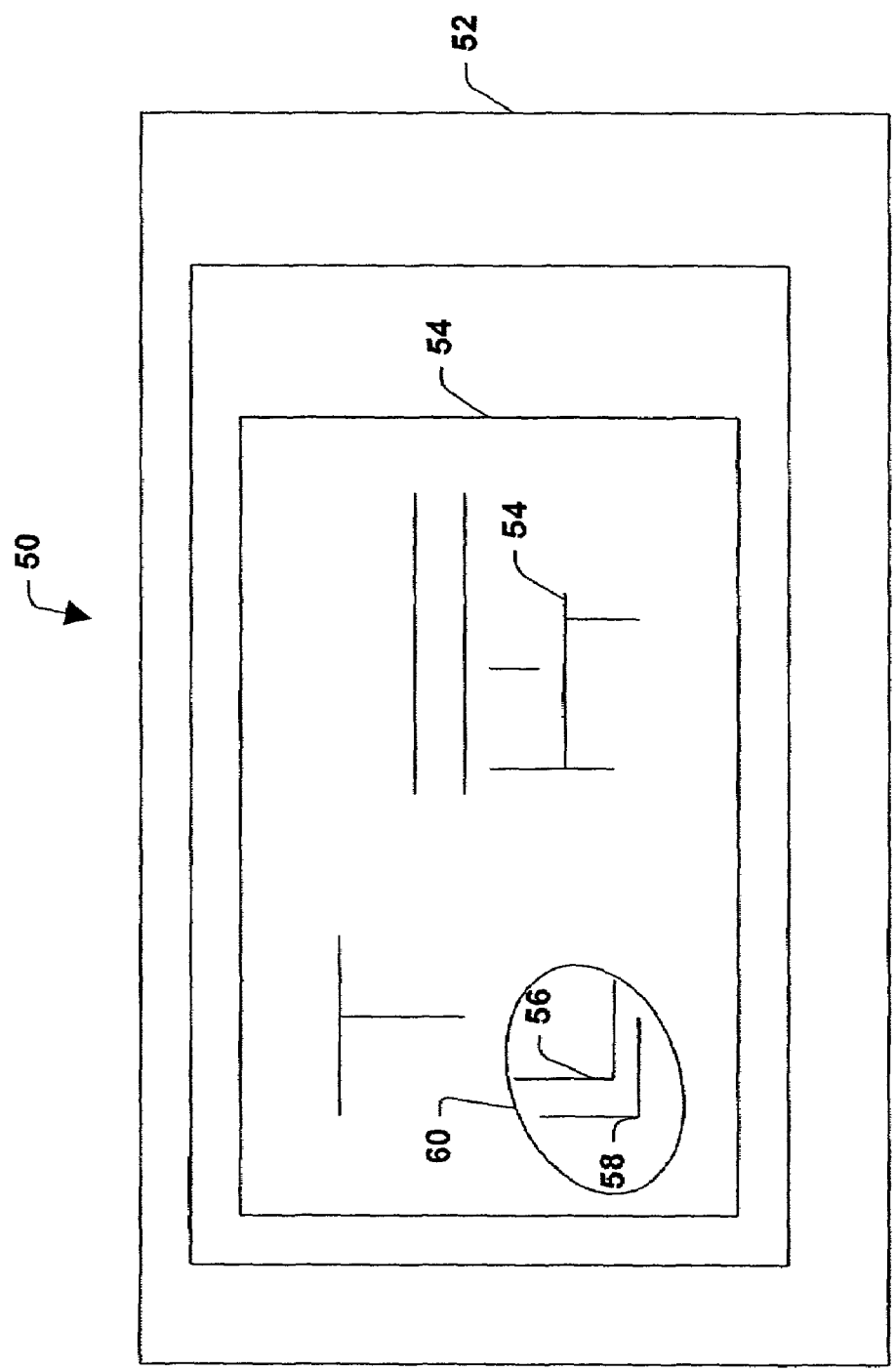
FIG. 1E is a plan view of an exemplary conventional reticle.

FIG. 1E illustrates a plan view of an exemplary conventional reticle 50 that consists of a glass plate 52 upon which a pattern of chrome polygon structures 54 are patterned. For the purpose of illustration the chrome polygon structures 54 are illustrated singularly, 56 and 58. The reticle 50 is typically formed by sputter depositing a blanket coating of chrome on the glass plate 52. The chrome layer is then coated with a photoresist that is, in turn, patterned and developed to yield the desired chrome pattern. The chrome layer is then etched and the photoresist stripped to yield the finished pattern of chrome polygon structures 54. As discussed above, feeding forward control data from a previous reticle fabrication process and/or apparatus to a subsequent reticle fabrication process and/or apparatus can be employed to facilitate producing polygon structures 54 with more precise CDs.

FIG. 1F is a highly magnified plan view of the portion of the reticle 50 circumscribed by the dashed oval 60 and shows the polygon structures 56 and 58 are generally L-shaped structures with adjacently positioned angled surfaces.

Figure 2:
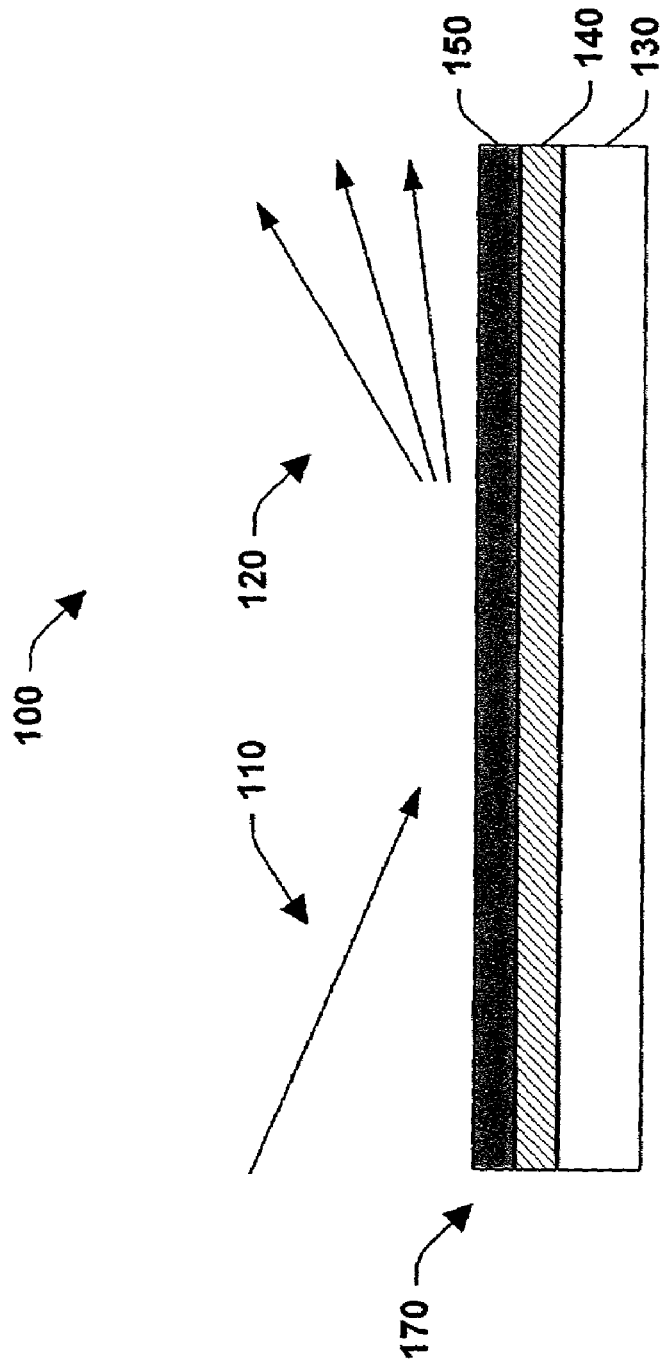
FIG. 2 illustrates a scatterometry beam being directed at a reticle after application of a photoresist, in accordance with an aspect of the present invention.

FIG. 2 illustrates the operation of a portion of a system 100 employed in reticle fabrication. The system 100 includes a scatterometry beam 110 being directed at a reticle 170. The reticle 170 is illustrated as including a substantially transparent layer 130 (e.g., quartz) and a substantially opaque layer 140 (e.g., chrome) substantially covered with a photoresist layer 150. While the reticle 170 is illustrated as including two layers, it is to be appreciated that a reticle with a different number of layers may be fabricated in accordance with the present invention. Furthermore, while the substantially transparent layer 130 may be quartz, it is to be appreciated that other substantially transparent layers may be employed in accordance with the present invention. Further still, while the substantially opaque layer 140 may be chrome, it is to be appreciated that other substantially opaque layers may be employed in accordance with the present invention.

The system 100 can measure parameters associated with, for example, the photoresist 150 including, but not limited to, the depth of the photoresist 150, the chemical composition of the photoresist 150 and the planarity of the photoresist 150. Thus, the system 100 can be employed to improve reticle quality by facilitating not only process control for the photoresist application phase, but also for subsequent processes whose operating parameters may be controlled based on the results of the photoresist application phases. The system 100 can be employed in-situ (e.g., during fabrication) to control the fabrication of the mask 170 (e.g., to control the deposition of the photoresist 150) and/or can be employed, for example, to determine starting conditions and other subsequent process parameters for subsequent reticle fabrication phases. By way of illustration, the development time for the reticle 170 may depend, at least in part, on the depth and/or planarity of the photoresist layer 150. Thus, by analyzing the photoresist 150 during the photoresist application phase, and by feeding forward photoresist data and/or analysis results, for example, a subsequent development phase can be adapted based on the fed forward data. Thus, the subsequent development phase may start with more precise information than is conventionally employed in systems that employ historical norm data, for example.

The system 100 operates, at least in part, by directing the beam 110 at the reticle 170 and then collecting and analyzing a light 120 reflected and/or refracted by the reticle 170. Such analysis is accomplished through scatterometry, which will be discussed below.

Figure 3:
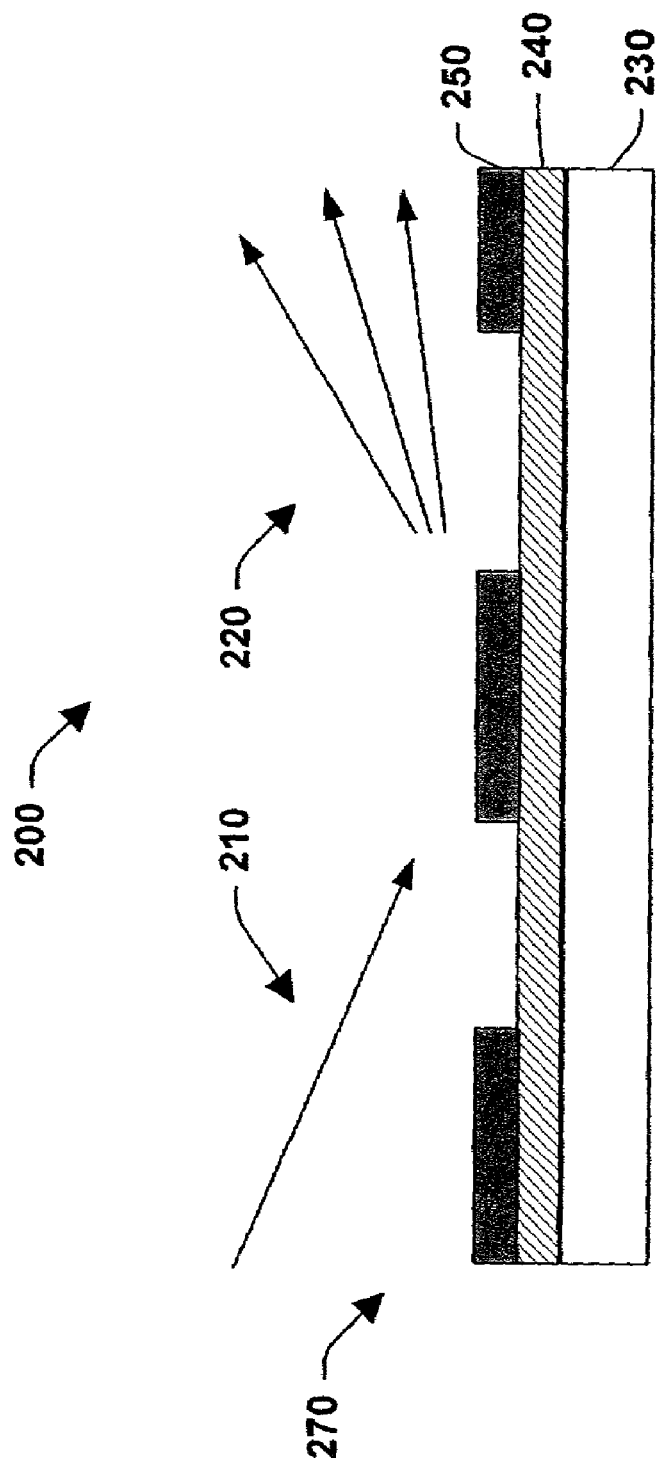
FIG. 3 illustrates a scatterometry beam being directed at a reticle after development, in accordance with an aspect of the present invention.

FIG. 3 illustrates the operation of a portion of a system 200 employed in reticle fabrication. The system 200 includes a scatterometry beam 210 being directed at a reticle 270 that has passed through a development phase. The reticle 270 is illustrated as including a substantially transparent layer 230 (e.g., quartz) and a substantially opaque layer 240 (e.g., chrome) with a patterned photoresist layer 250 that can be employed, for example, in patterning the substantially opaque layer 240. Data gathered during analysis of the development phase may be fed forward, for example, to a subsequent etch phase. Thus, the etch phase may start with more precise initial data than is possible in conventional systems that employ historical norm data and may, therefore, produce a higher quality reticle.

The system 200 can measure parameters of the patterned photoresist 250 including, but not limited to, the depth of the pattern, the location of the pattern, the planarity of the surface of the remaining photoresist 250, and the like. Thus, the system 200 can be employed to improve reticle quality by providing feed-forward control data to a subsequent fabrication phase, (e.g., an etch phase), whose operating parameters can be configured to account for the data from the previous phase. The system 200 operates, at least in part, by directing the beam 210 at the reticle 270 and then collecting and analyzing a light 220 reflected and/or refracted by the reticle 270. Such analysis is accomplished through scatterometry analysis of signatures generated by the reflected and/or refracted light.

Figure 4:
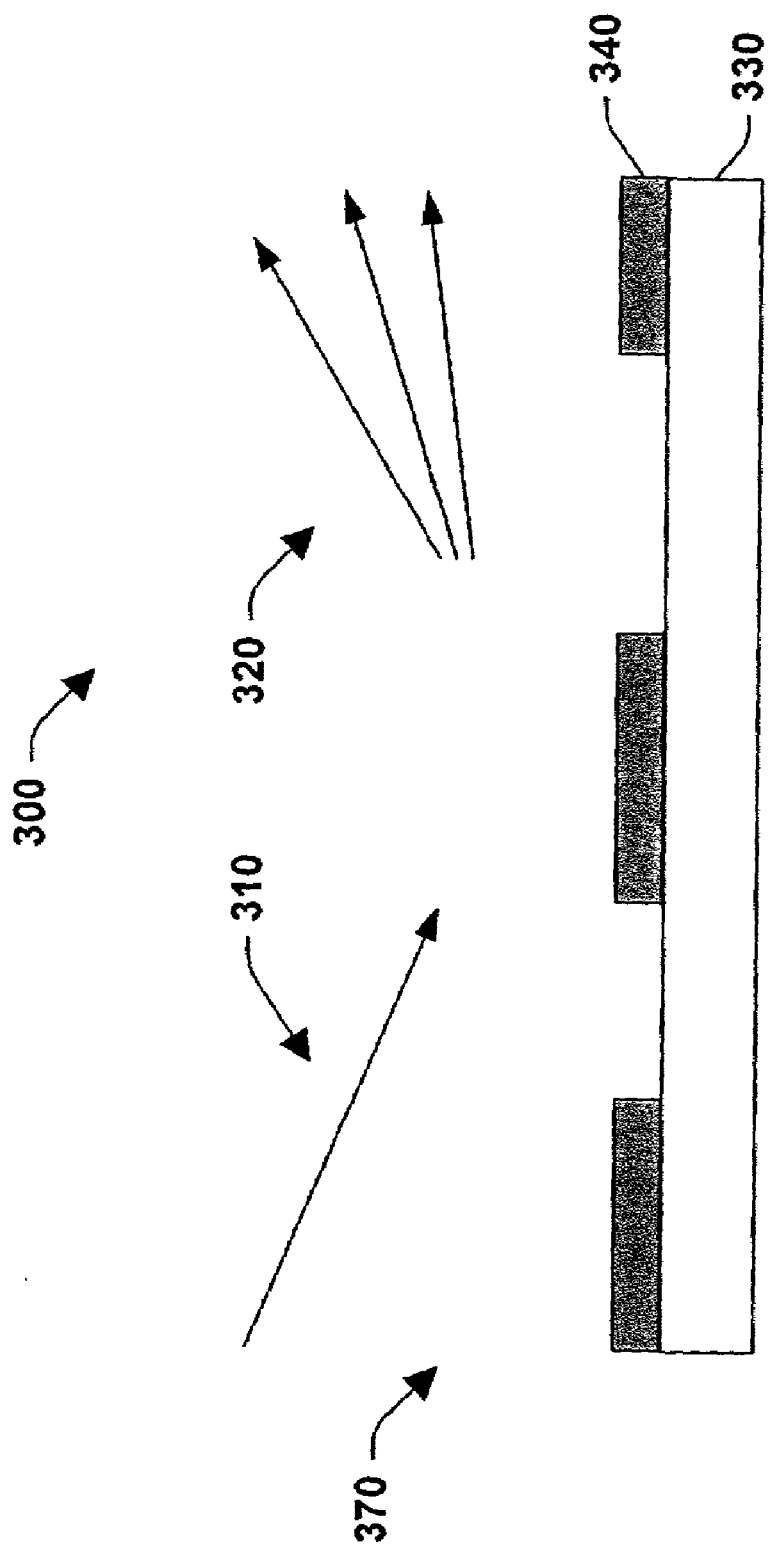
FIG. 4 illustrates a scatterometry beam being directed at a reticle after etching and resist stripping, in accordance with an aspect of the present invention.

FIG. 4 illustrates the operation of a portion of a system 300 employed in reticle fabrication. The system 300 includes a scatterometry beam 310 being directed at a reticle 370 that has passed through an etch phase and a resist strip phase. The mask 370 is illustrated as including a substantially transparent layer 330 (e.g., quartz) and a substantially opaque layer 340 (e.g., chrome) that has been etched, where the etching has benefited from receiving data fed forward from previous fabrication phases (e.g., resist application, development, etc.). The system 300 can measure parameters of the reticle 370 including, but not limited to, the height of the features in the chrome layer 340, the width of the features, the location of the features, and the like. Thus, the system 300 can be employed to improve reticle quality, and thus the quality of patterns projected during semiconductor fabrication processes. The system 300 can be employed in-situ (e.g., during fabrication) to control the fabrication of the mask 370 and/or can be employed ex-situ, (e.g., post fabrication) in processes like quality control. Thus, data gathered during analysis of the beams 320 can be fed forward to subsequent processes (e.g., chrome application, resist application, etc.) for further processing of the reticle 370.

The system 300 operates, at least in part, by directing the beam 310 at the reticle 370 and then collecting and analyzing a light 320 reflected and/or refracted by the reticle 370. While FIG. 3 illustrates the light 310 being directed only at the top of the reticle 370, it is to be appreciated that light may be directed at either side and/or both sides of the reticle 370 in accordance with the present invention.

Figure 5:
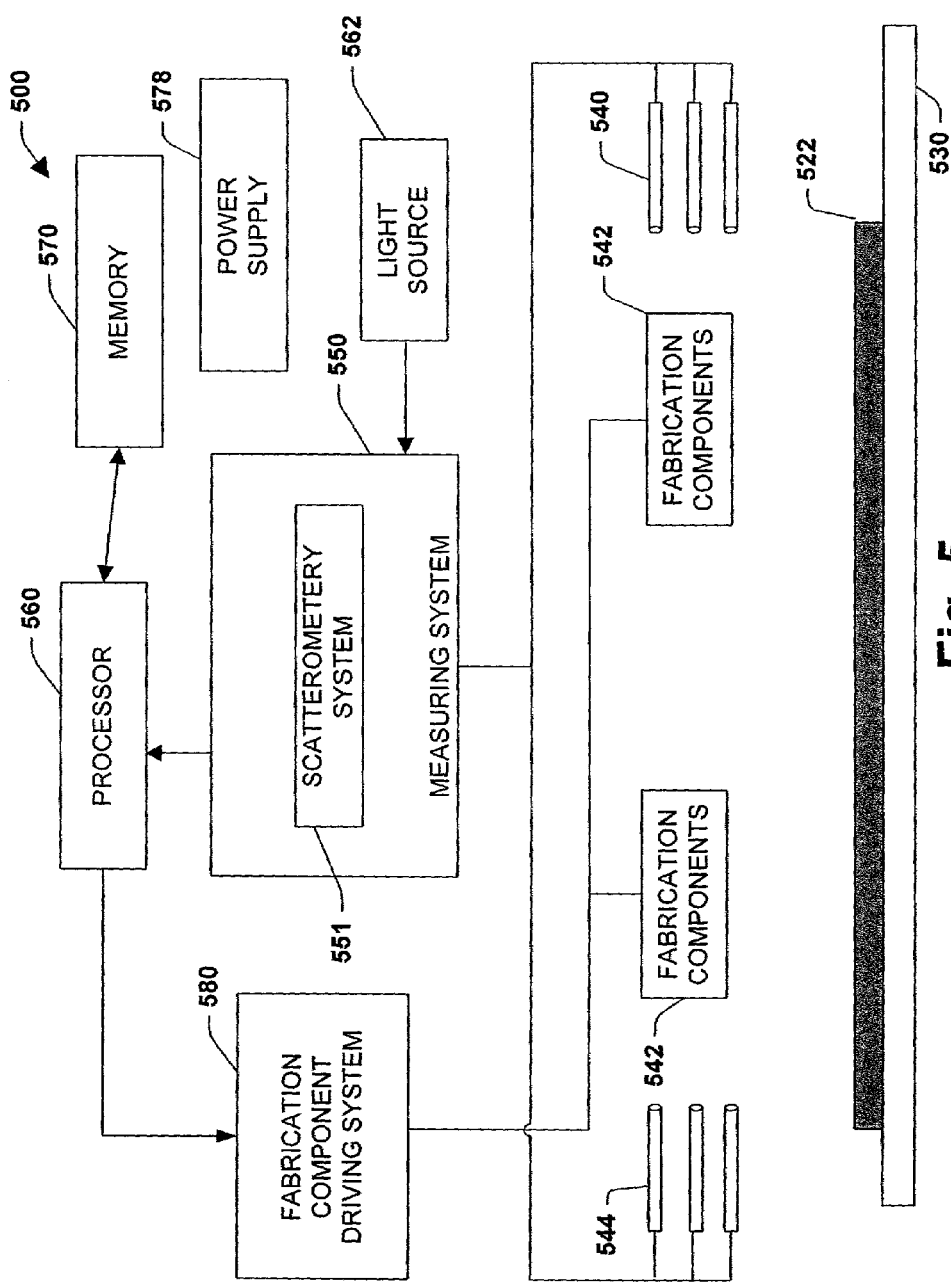
FIG. 5 is a schematic block diagram of a feed-forward reticle fabrication system, in accordance with an aspect of the present invention.

Turning now to FIG. 5, a system 500 that feeds forward reticle fabrication data to subsequent apparatus and/or processes employed in reticle fabrication is illustrated. One or more fabrication components 542 will operate on a reticle 522 being fabricated. One or more light sources 544 project light onto respective portions of the reticle 522. A portion of the reticle 522 may have one or more features (e.g., apertures) on that portion. Furthermore, in one example of the present invention, a portion may have one or more gratings fabricated thereon. Light reflected by the reticle 522, gratings and/or apertures is collected by one or more light detecting components 540, and processed by a measuring system 550 to measure at least one parameter relating to the reticle fabrication. The reflected light is processed with respect to the incident light in measuring the various parameters. By way of illustration, the depth, width and/or profiles of the features, apertures, gratings and/or layers will cause the reflected light to be reflected in different, quantifiable manners. The reflected light may thus generate signatures, which can be used to facilitate feedback control of the fabrication components 542 via the fabrication component driving system 580. The reflected light may also generate signatures that can be employed to generate feed forward data that can be employed to configure and/or control, at least in part, apparatus and/or processes employed in subsequent reticle 522 fabrication.

The measuring system 550 includes a scatterometry system 551. It is to be appreciated that any suitable scatterometry system may be employed to carry out the present invention and that such systems are intended to fall within the scope of the claims appended hereto. A source of light 562 (e.g., a laser) provides light to the one or more light sources 544 via the measuring system 550. Preferably, the light source 562 is a frequency stabilized laser, however, it will be appreciated that any laser or other light source (e.g., laser diode or helium neon (HeNe) gas laser) suitable for carrying out the present invention may be employed. One or more light detecting components 540 (e.g., photo detector, photo diodes) collect light reflecting from the reticle 522.

A processor 560 receives the measured data from the measuring system 550 and analyzes one or more parameters associated with the current fabrication phase. The processor 560 is operatively coupled to the measuring system 550 and is programmed to control and operate the various components within the system 500 in order to carry out the various functions described herein. The processor, or CPU 560, may be any of a plurality of processors, such as the AMD Athlon, K7 and/or other similar and compatible processors. The manner in which the processor 560 can be programmed to carry out the functions relating to the present invention will be readily apparent based on the description provided herein.

A memory 570, which is operatively coupled to the processor 560, is also included in the system 500 and serves to store program code executed by the processor 560 for carrying out operating functions of the system 500 as described herein. The memory 570 also serves as a storage medium for temporarily storing information and data that may be employed in carrying out the present invention.

A power supply 578 provides operating power to the system 500. Any suitable power supply (e g., battery, line power) may be employed to carry out the present invention. The processor 560 is also coupled to a fabrication component driving system 580 that drives the fabrication components 542. The processor 560 controls the fabrication component driving system 580 to selectively control the fabrication components 542. The processor 560 monitors the reticle 522 via the signatures generated by the reflected and/or diffracted light, and selectively regulates the fabrication of the reticle 522 via the corresponding fabrication components 542. Such regulation enables controlling CDs during fabrication and further facilitates initiating a subsequent fabrication phase with more precise initial data, which facilitates improving reticle quality, which in turn improves fidelity of image transfer in a lithographic process. Improved precision of image transfer enables smaller feature sizes and thus enables higher packing densities.

Figure 6:
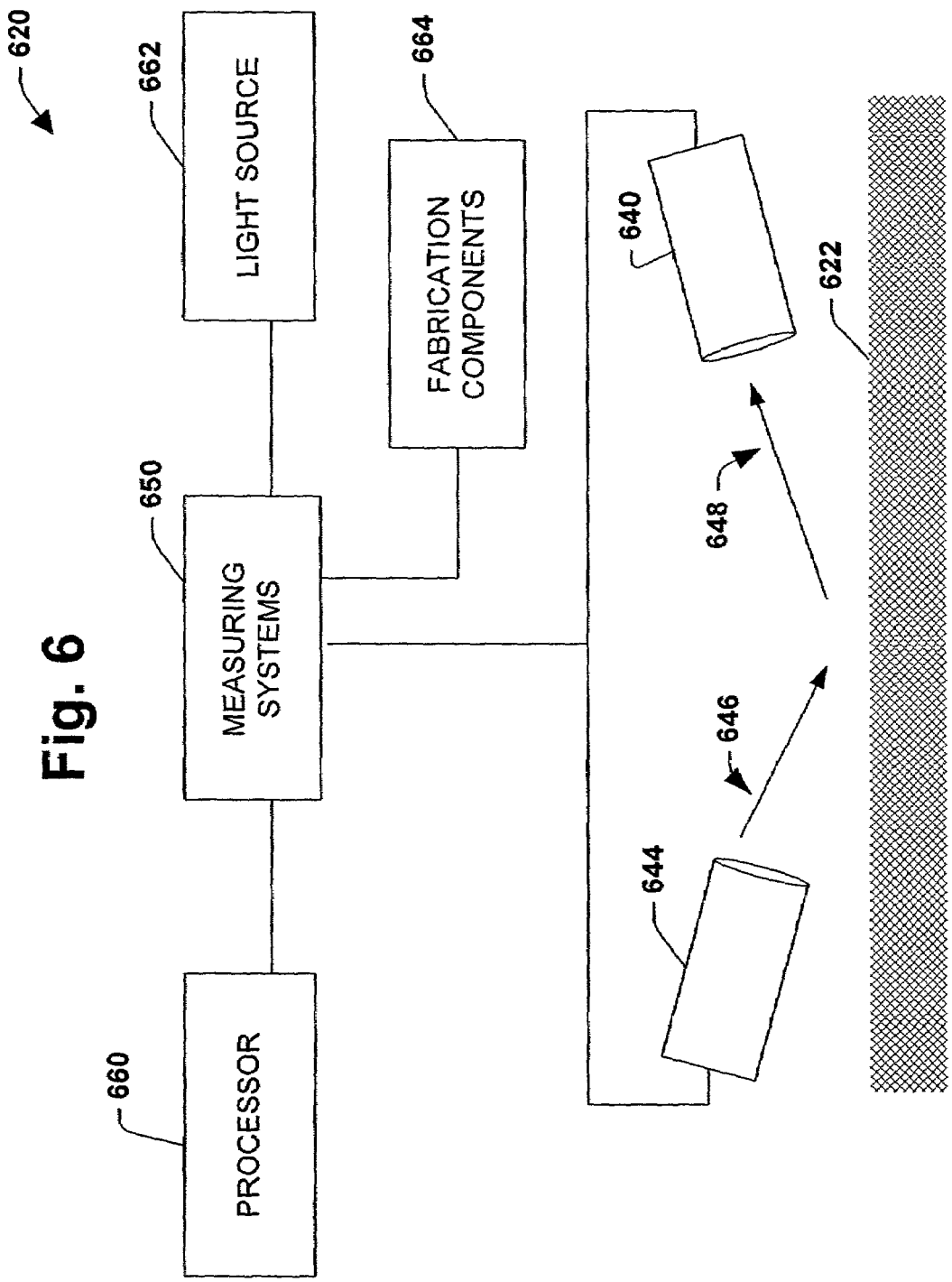
FIG. 6 is a partial schematic block diagram of the system of FIG. 5 illustrating a feed-forward reticle fabrication system, in accordance with the an aspect of present invention.

FIG. 6 illustrates a system 620 being employed to gather reticle fabrication data via light reflected from the reticle 622 and to feed forward such data and/or other items including, but not limited to control signals, initial data, reconfiguration parameters, interrupts, signals, data packets and the like to one or more fabrication components 664. The light source 644 directs a light 646 incident to the surface of the reticle 622. The angle and/or phase, for example, of a light 648 reflected and/or diffracted from the surface of the reticle 622 will vary in accordance with the CDs of layers and features, for example, on the reticle 622 during various reticle fabrication stages. The light detecting component 640 collects the reflected and/or diffracted light 648 and passes the collected light, and/or data concerning the collected light to the measuring system 650. The measuring system 650 processes the reflected light 648 and/or data concerning the reflected light 648 in accordance with scatterometry techniques to provide the processor 660 with data corresponding to the measured CDs in the reticle 622. The reflected light 648 may generate a scatterometry signature that can be compared to one or more signatures to determine whether to feed forward data to one or more fabrication components 664. For example, the signature may indicate that the reticle 622 has a photoresist layer of a first known depth and that etching should therefore occur with a first set of pre-determined values.

Turning now to FIGS. 7–9 a chuck 730 is shown in perspective supporting a reticle 722 whereupon one or more features 724, layers and/or gratings may be located. The reticle 722 may be divided into a grid pattern as shown in FIG. 8. Each grid block (XY) of the grid pattern corresponds to a particular portion of the reticle 722, and each grid block may have one or more features 724, layers and/or gratings associated with that grid block. Portions can be individually monitored for properties including, but not limited to, the planarity of a photoresist layer, the depth of a photoresist layer, the chemical composition of a photoresist layer, the planarity of a substantially opaque reticle layer, the chemical composition of a substantially opaque reticle layer, the depth of a substantially opaque reticle layer, the location of one or more features in the substantially opaque reticle layer, the depth of one or more features in the substantially opaque reticle layer, the width of one or more features in the substantially opaque reticle layer, the slope angles of the walls of one or more features in the substantially opaque reticle layer, the planarity of a substantially transparent reticle layer, the chemical composition of a substantially transparent reticle layer, the depth of a substantially transparent reticle layer, the location of one or more features in the substantially transparent reticle layer, the depth of one or more features in the substantially transparent reticle layer, the width of one or more features in the substantially transparent reticle layer, the slope angles of the walls of one or more features in the substantially transparent reticle layer and the location of one or more defects in the substantially transparent reticle layer, and each portion may be individually controlled for fabrication processes including, but not limited to, photoresist application processes, photoresist development processes, etching processes, resist stripping processes, spin track processes, stepper processes, post exposure bake processes, polishing processes, quality control processes, and the like. It is to be appreciated that although one or more fabrication components can be associated with each grid block, that a greater or lesser number of fabrication components may be employed in the present invention.

In FIG. 8, one or more features, layers and/or gratings in respective portions of a reticle $(X_1Y_1 \ldots X_{12}, Y_{12})$ are being monitored for fabrication parameters associated with the current fabrication phase. The signatures for the features, layers and/or gratings are shown. It is to be appreciated that although FIG. 7 illustrates the reticle 722 being mapped (partitioned) into 144 grid block portions, the reticle 722 may be mapped with any suitable number of portions and any suitable number of features 724, layers and/or gratings may be fabricated thereon. Given the set of signatures recorded in FIG. 8, it may be determined that fabrication data should be fed forward to apparatus and/or processes downstream from the current fabrication phase. It is possible that a determination may be made that the reticle has reached a condition where further fabrication is undesired, and thus, no feed-forward information may be generated and instead, the reticle may be scrapped.

FIG. 9 illustrates a table of acceptable and unacceptable signatures. It can be seen that the signatures are acceptable except a signature for grid $X_7Y_6$. The set of signatures depicted in FIG. 9 can be analyzed collectively as a master signature, can be analyzed in subsets to evaluate, for example, intermediate etching progress, and/or can be analyzed individually to determine whether, for example, an acceptable etching condition exists. The analysis of the signatures can be employed in-situ to control one or more fabrication components and/or can be employed to generate feed-forward information that can be supplied to downstream apparatus and/or processes.

Figure 10:
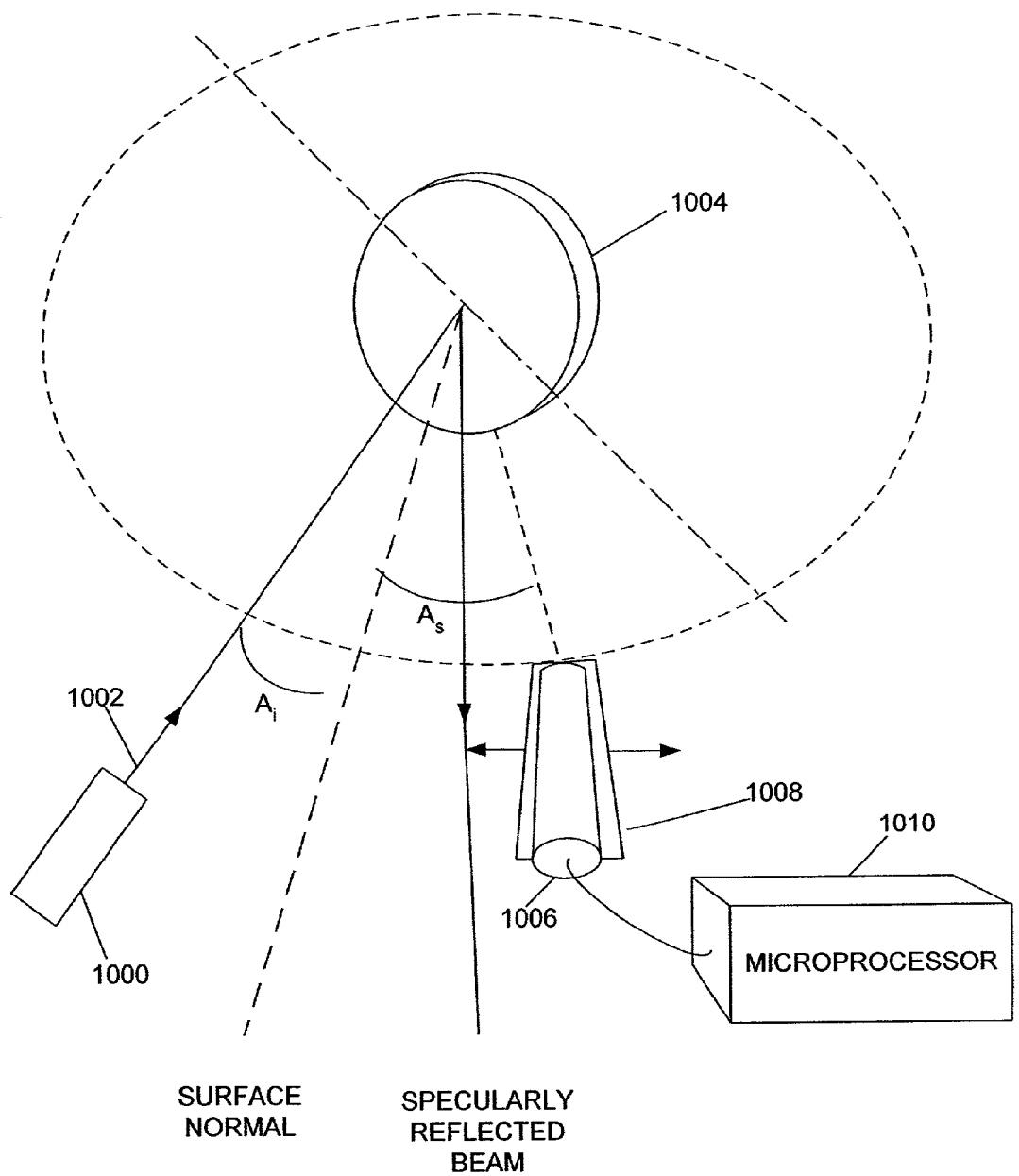
FIG. 10 illustrates an exemplary scatterometry system collecting reflected light in accordance with an aspect of the present invention.

FIG. 10 illustrates an exemplary scatterometry system collecting reflected and/or diffracted light. Light from a laser 1000 is brought to focus in any suitable well-known manner to form a beam 1002. A sample, such as a reticle 1004 is placed in the path of the beam 1002 and a photo detector or photo multiplier 1006 of any suitable well-known construction. Different detector methods may be employed to determine the scattered power. To obtain a grating pitch, the photo detector or photo multiplier 1006 may be mounted on a rotation stage 1008 of any suitable well-known design. A microprocessor 1010, of any suitable well-known design, may be used to process detector readouts, including, but not limited to, angular locations of different diffracted orders leading to diffraction grating pitches being calculated. Thus, light reflected and/or diffracted from the sample 1004 may be accurately measured.

Figure 11:
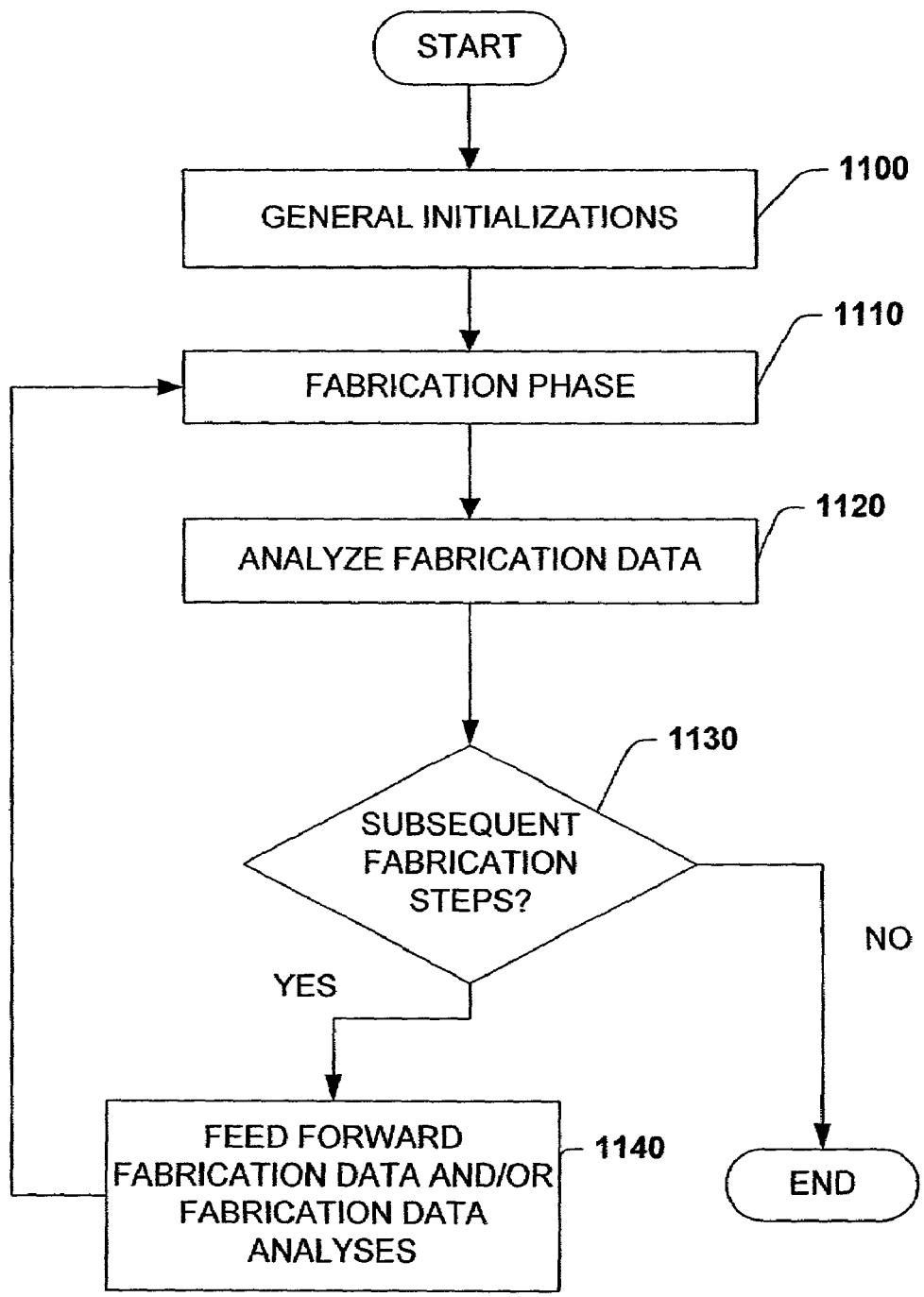
FIG. 11 is a flow diagram illustrating an example of a methodology for feeding forward reticle fabrication data, in accordance with an aspect of the present invention.

In view of the exemplary systems shown and described above, methodologies that may be implemented in accordance with the present invention, will be better appreciated with reference to the flow diagram of FIG. 11. While, for purposes of simplicity of explanation, the methodology of FIG. 11 is shown and described as a series of blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with the present invention.

FIG. 11 is a flow diagram illustrating one particular methodology for carrying out the present invention. At 1100, general initializations occur. The initializations may include, but are not limited to, establishing data communications, establishing initial values, identifying communicating apparatus and/or processes and positioning reticle fabrication means and products, for example.

At 1110, a fabrication phase occurs. For example, a photoresist may be applied to a reticle. At 1120, data associated with the fabrication phase of 1110 may be analyzed. For example, the depth of the photoresist and/or the planarity of the photoresist may be analyzed. Such data and/or analyses may be employed to generate feed-forward data that can be made available to subsequent fabrication phases. By way of illustration, the photoresist data may be analyzed to generate data that can be employed in a development phase.

At 1130, a determination is made concerning whether there is a subsequent fabrication step and/or apparatus that could benefit from the feed forward data. If the determination at 1130 is NO, then the feed-forward data generation process for that fabrication phase may conclude. But if the determination at 1130 is YES, then at 1140 the method may feed such feed-forward data forward to a downstream process and/or apparatus. By way of illustration, feed forward data gathered and/or generated during a development phase may be fed forward to an etch phase.

Scatterometry is a technique for extracting information about a surface upon which an incident light has been directed. Information concerning properties including, but not limited to, dishing, erosion, profile, thickness of thin films and critical dimensions of features present on and/or in the surface can be extracted. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the chemical properties of the surface, the planarity of the surface, features on the surface, voids in the surface, and the number and/or type of layers beneath the surface.

Different combinations of the above-mentioned properties will have different effects on the phase and/or intensity of the incident light resulting in substantially unique intensity/phase signatures in the complex reflected and/or diffracted light. Thus, by examining a signal (signature) library of intensity/phase signatures, a determination can be made concerning the properties of the surface. Such substantially unique phase/intensity signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N = n - jk$$

where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer can generate a second phase/intensity signature. For example, a line of a first width may generate a first signature while a line of a second width may generate a second signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received from scatterometry detecting components, the phase/intensity signals can be pattern matched, for example, to the library of signals to determine whether the signals correspond to a stored signature.

Figure 12:
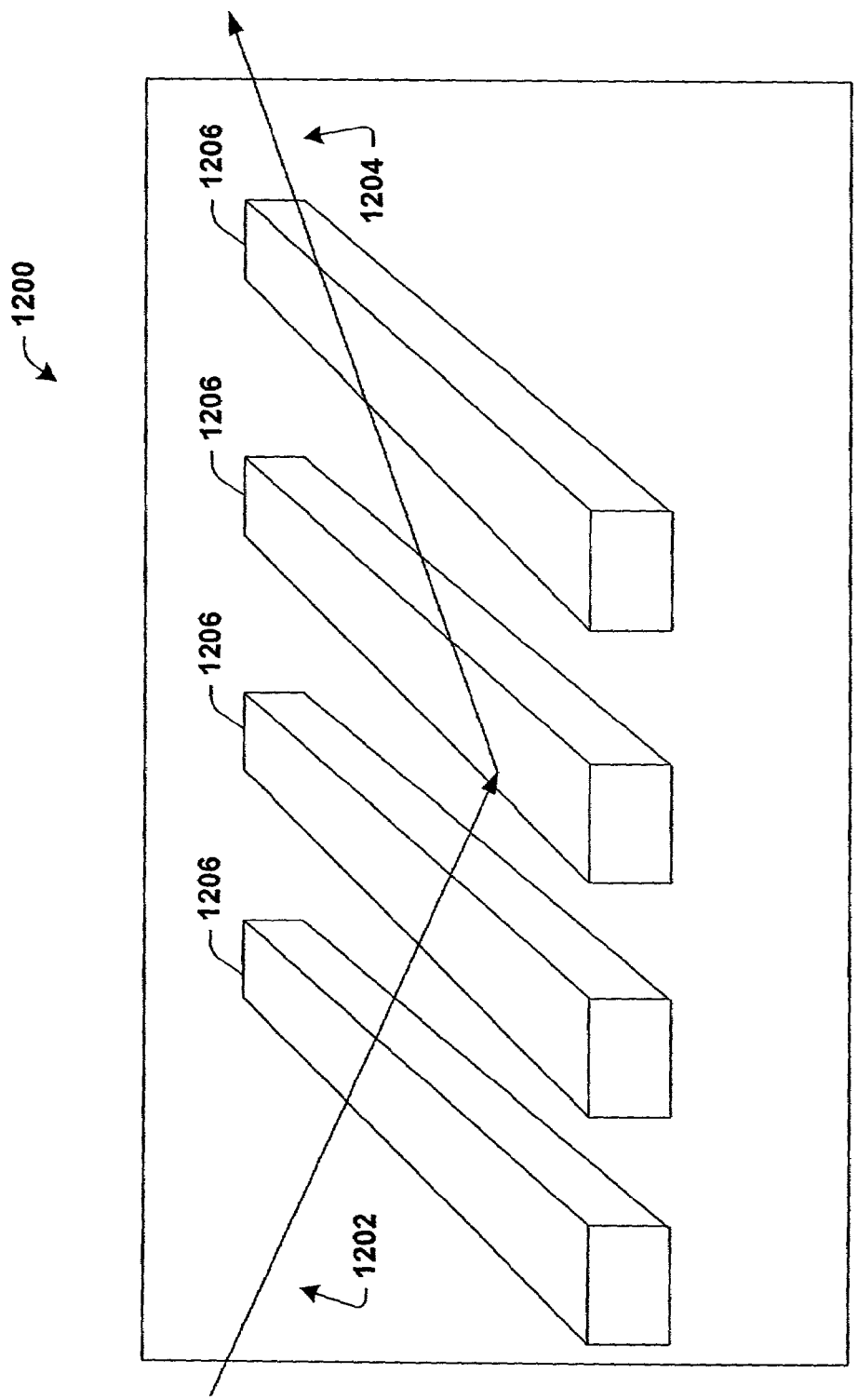
FIG. 12 is a simplified perspective view of an incident light reflecting off a surface, in accordance with an aspect of the present invention.

To illustrate the principles described above, reference is now made to FIGS. 12 through 17. Referring initially to FIG. 12, an incident light 1202 is directed at a surface 1200, upon which one or more features 1206 may exist. In FIG. 12 the incident light 1202 is reflected as reflected light 1204. The properties of the surface 1200, including but not limited to, thickness, uniformity, planarity, chemical composition and the presence, critical dimensions (CDs), profiles of such features, can affect the reflected light 1204. In FIG. 12, the features 1206 are raised upon the surface 1200. The phase and intensity of the reflected light 1204 can be measured and plotted, as shown, for example, in FIG. 16. The phase 1550 (FIG. 16) of the reflected light 1204 can be plotted, as can the intensity 1652 (FIG. 16) of the reflected light 1204. Such plots can be employed to compare measured signals with signatures stored in a signature library using techniques like pattern matching, for example.

Figure 13:
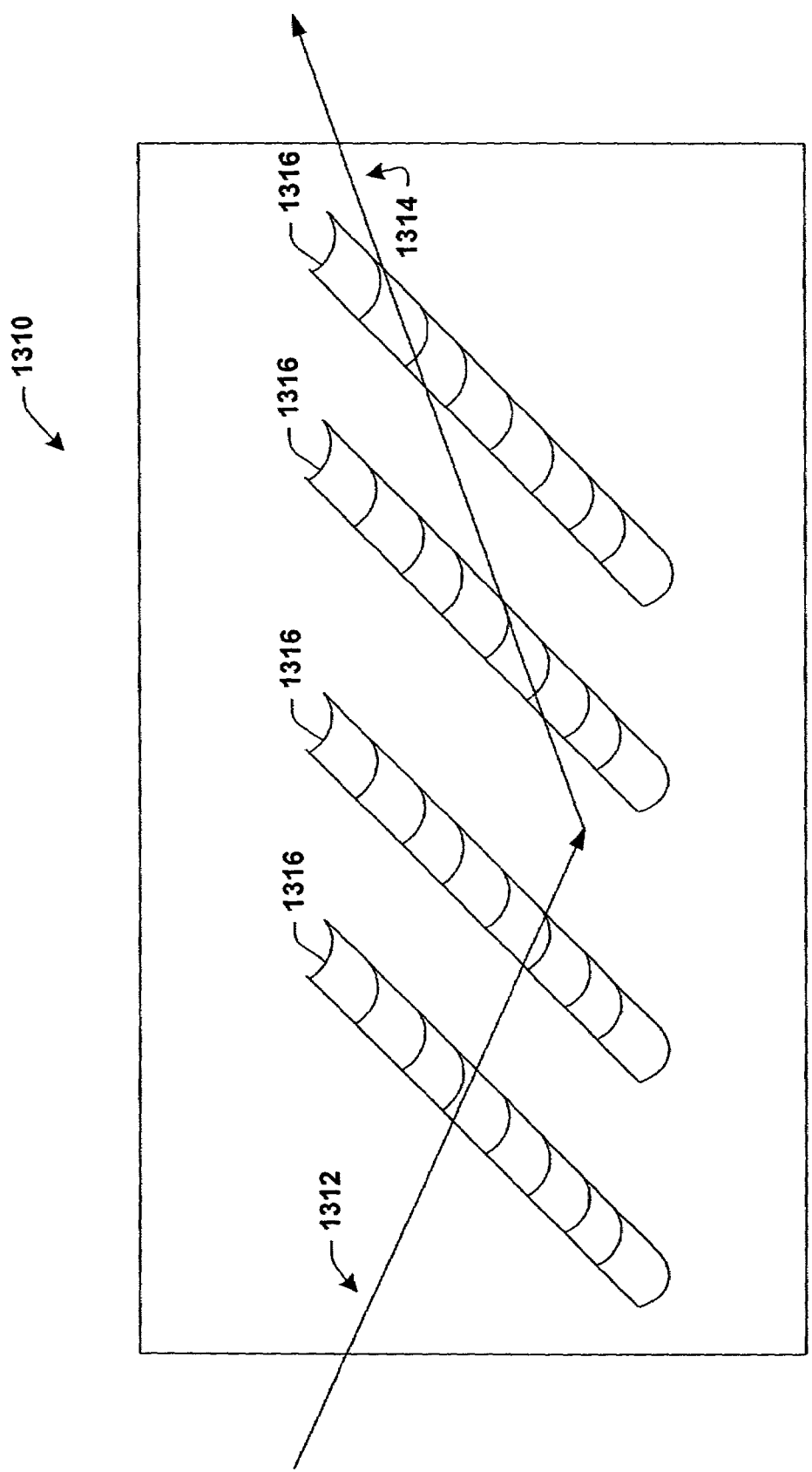
FIG. 13 is a simplified perspective view of an incident light reflecting off a surface, in accordance with an aspect of the present invention.

Referring now to FIG. 13, an incident light 1312 is directed onto a surface 1310 upon which one or more depressions 1316 appear. The incident light 1312 is reflected as reflected light 1314. Like the one or more features 1206 (FIG. 12) may affect an incident beam, so too may the one or more depressions 1316 and/or the CDs and profile of the depressions 1316 affect an incident beam. Thus, it is to be appreciated that scatterometry can be employed to measure features appearing on a surface, features appearing in a surface, and properties of a surface itself, regardless of features.

Figure 14:
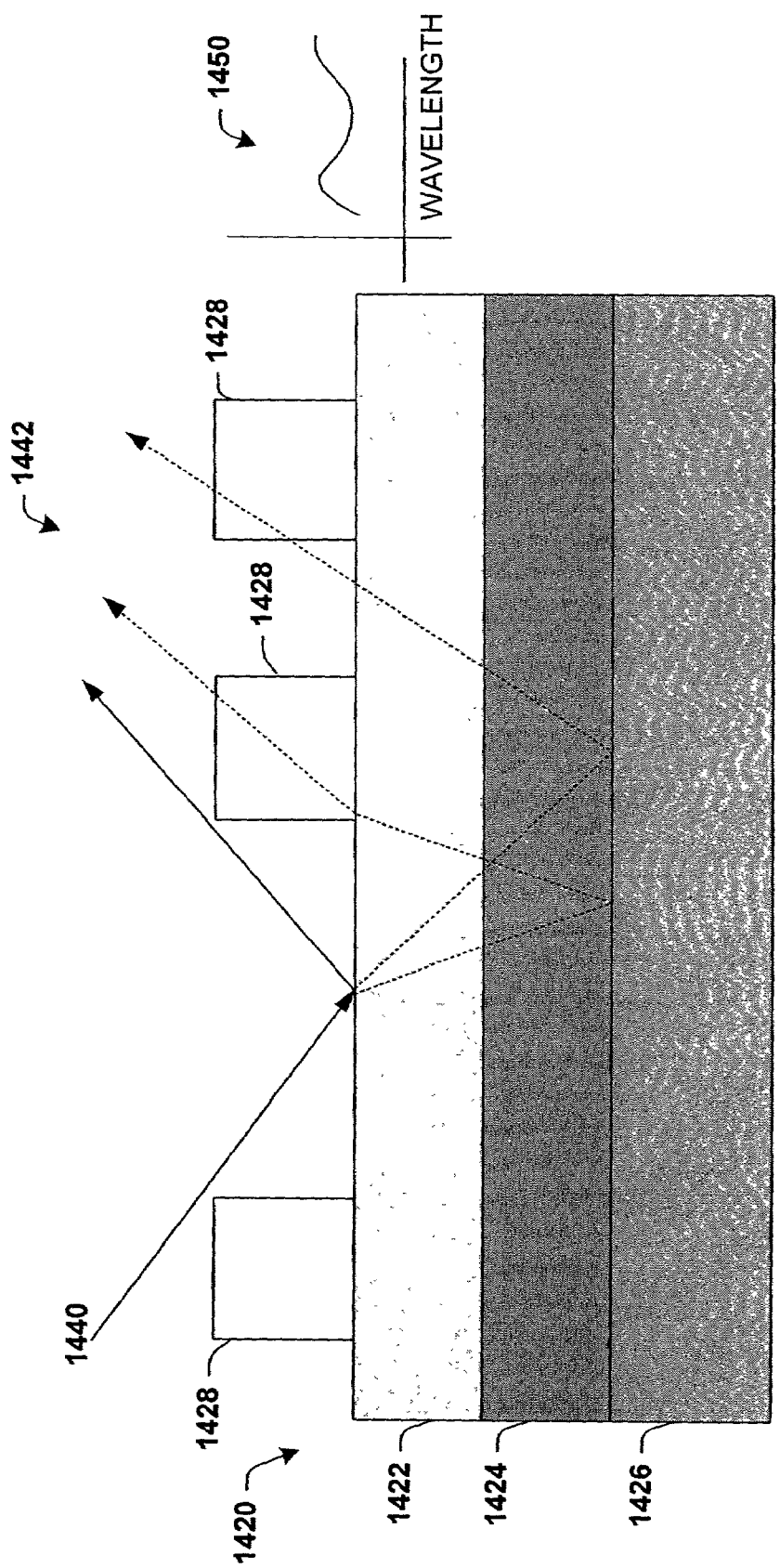
FIG. 14 illustrates a complex reflected and refracted light produced when an incident light is directed onto a surface, in accordance with an aspect of the present invention.

Turning now to FIG. 14, complex reflections and refractions of an incident light 1440 are illustrated. The reflection and refraction of the incident light 1440 can be affected by factors including, but not limited to, the presence of one or more features 1428, and the composition of the substrate 1420 upon which the features 1428 reside. For example, properties of the substrate 1420 including, but not limited to the thickness of a layer 1422, the chemical properties of the layer 1422, the opacity and/or reflectivity of the layer 1422, the thickness of a layer 1424, the chemical properties of the layer 1424, the opacity and/or reflectivity of the layer 1424, the thickness of a layer 1426, the chemical properties of the layer 1426, and the opacity and/or reflectivity of the layer 1426 can affect the reflection and/or refraction of the incident light 1440. Thus, a complex reflected and/or refracted light 1442 may result from the incident light 1440 interacting with the features 1428, and/or the layers 1422, 1424 and 1426. Although three layers 1422, 1424 and 1426 are illustrated in FIG. 14, it is to be appreciated that a substrate can be formed of a greater or lesser number of such layers.

Figure 15:
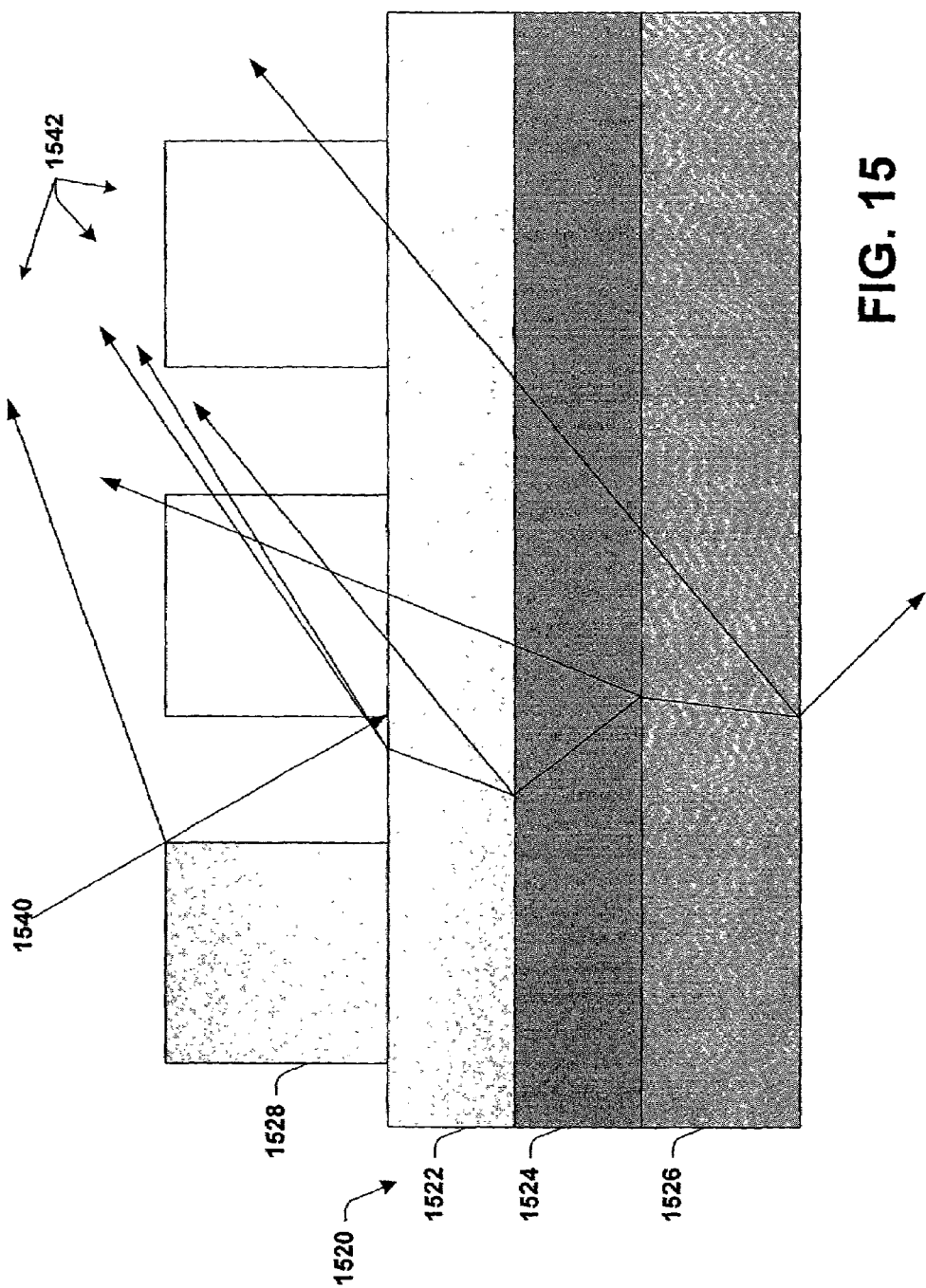
FIG. 15 illustrates a complex reflected and refracted light produced when an incident light is directed onto a surface, in accordance with an aspect of the present invention.
Figure 16:
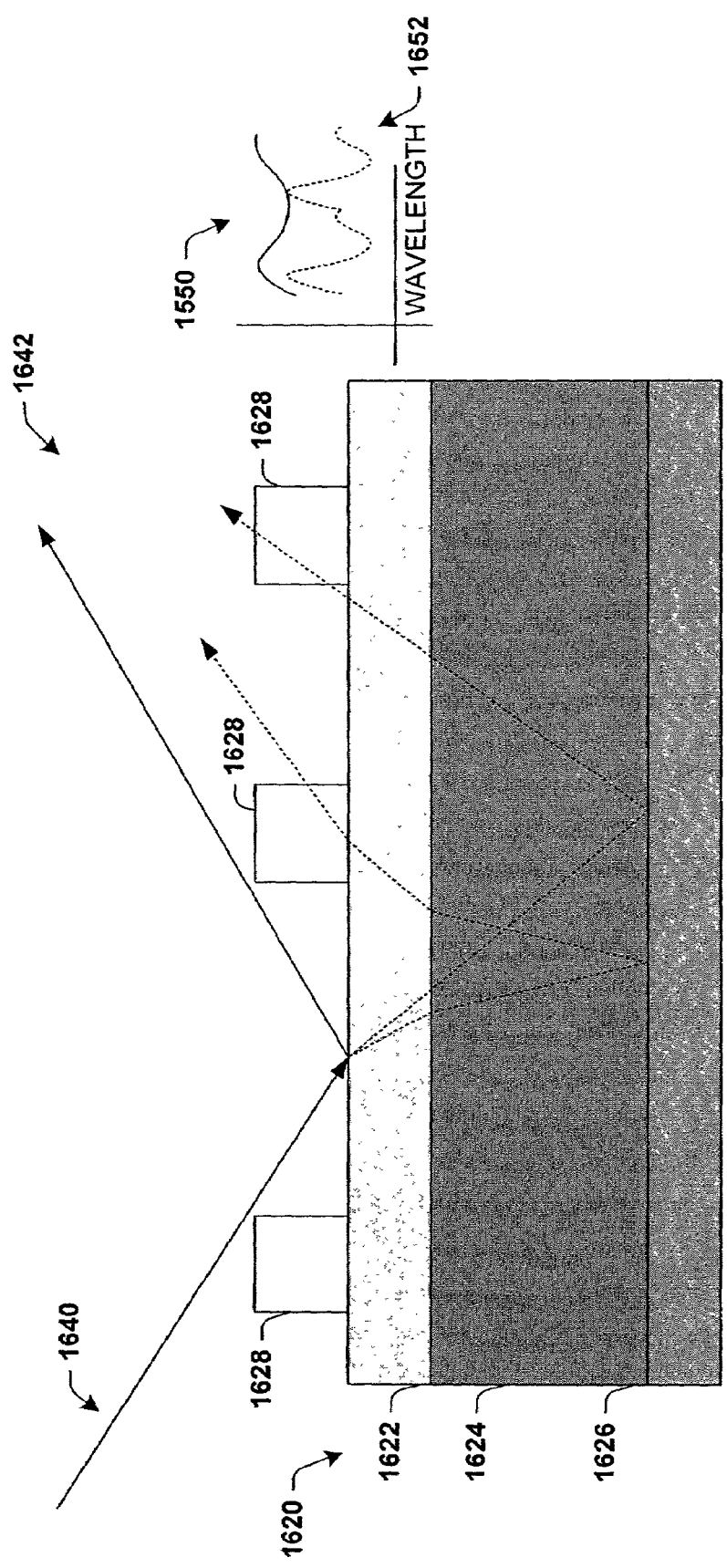
FIG. 16 illustrates a complex reflected and refracted light produced when an incident light is directed onto a surface, in accordance with an aspect of the present invention.
Figure 17:
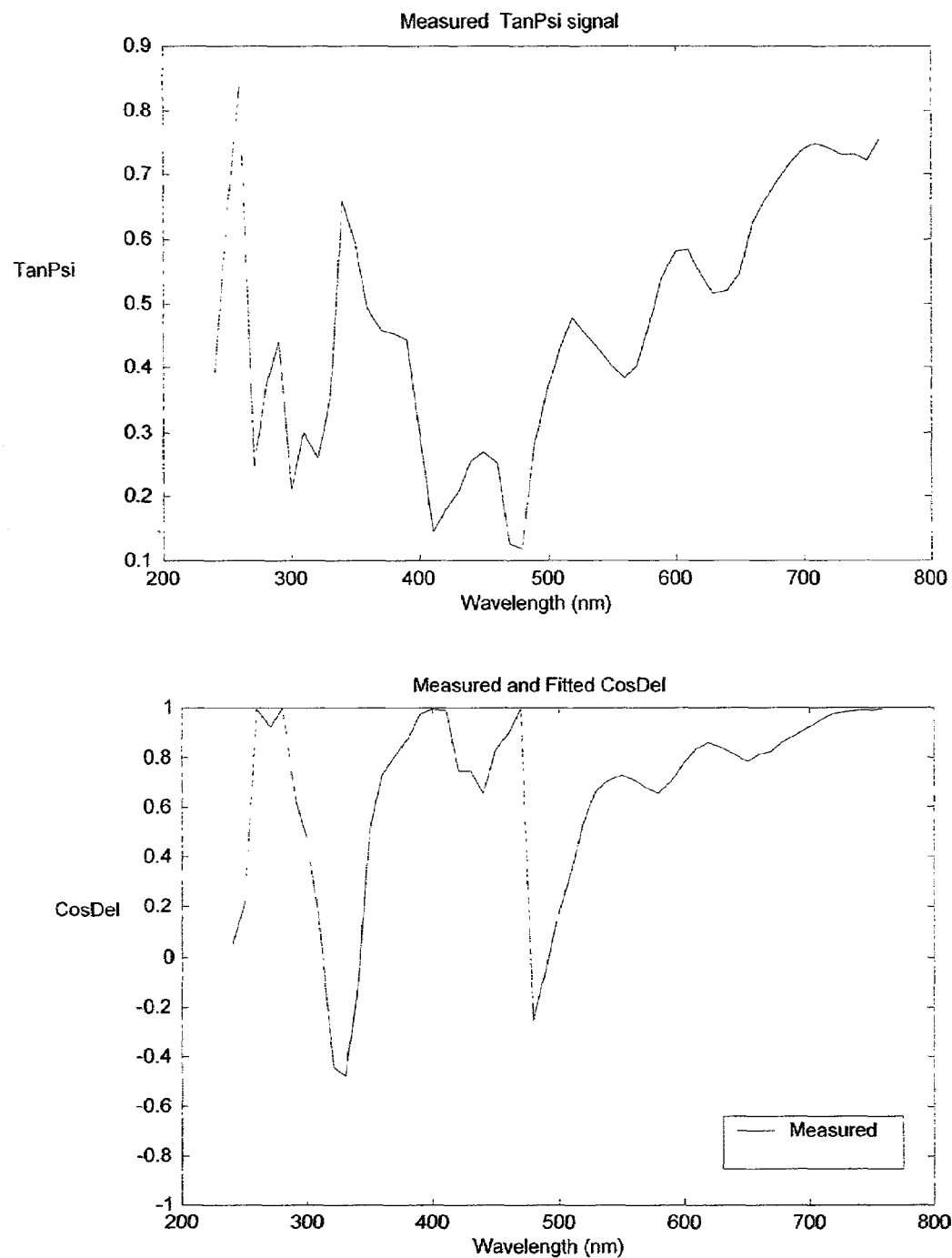
FIG. 17 illustrates phase and intensity signals recorded from a complex reflected and refracted light produced when an incident light is directed onto a surface, in accordance with an aspect of the present invention.

Turning now to FIG. 15, one of the properties from FIG. 14 is illustrated in greater detail. The substrate 1520 can be formed of one or more layers 1522, 1524 and 1526. The phase 1550 (FIG. 16) of the reflected and/or refracted light 1542 can depend, at least in part, on the thickness of a layer, for example, the layer 1524. Thus, in FIG. 16, the phase 1652 of the reflected light 1642 differs from the phase 1550 due, at least in part, to the different thickness of the layer 1624 in FIG. 16.

Thus, scatterometry is a technique that can be employed to extract information about a surface and/or features upon which an incident light has been directed. The information can be extracted by analyzing phase and/or intensity signals of a complex reflected and/or diffracted light. The intensity and/or the phase of the reflected and/or diffracted light will change based on properties of the surface and/or features upon which the light is directed, resulting in substantially unique signatures that can be analyzed to determine one or more properties of the surface and/or features upon which the incident light was directed.

Described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for feeding forward reticle fabrication data, comprising:
   one or more fabricating components adapted to perform one or more reticle fabrication processes;
   a control system operatively connected to at least one of the one or more fabricating components, the control system adapted to control, at least in part, the operation of at least one of the one or more fabricating components and to map a reticle into a grid pattern consisting of a plurality of grid blocks;
   one or more measurement components operatively connected to the control system, the one or more measurement components adapted to measure, via scatterometry, one or more reticle fabrication parameters from one or more reticle fabrication processes at one or more grid blocks; and
   a signature data store operatively connected to the control system, the signature data store adapted to store one or more scatterometry signatures, each signature containing data for one or more grid blocks.

2. The system of claim 1 where the control system is further adapted to analyze one or more reticle fabrication parameters from a reticle fabrication process and to selectively feed forward control data to one or more of the fabricating components.

3. The system of claim 2 where at least one fabricating component is further adapted to initialize a reticle fabrication process performed by the fabricating component based, at least in part, on the control data forwarded by the control system.

4. The system of claim 3 where the one or more fabricating components comprise at least one of a photoresist coater, a photoresist developer, an etcher, a resist stripper, a mask exposure tool beam including any one of an e-beam pattern, laser pattern generator or a mask repeater, a post exposure bake plate, a polisher and a quality control processor.

5. The system of claim 4 where the control system comprises:
   a microprocessor programmed to analyze the one or more fabrication parameters; and
   a memory, operatively connected to the microprocessor, the memory adapted to store one or more program instructions associated with analyzing the one or more fabrication parameters.

6. The system of claim 5 where the one or more measurement components comprise a scatterometry system adapted to generate one or more scatterometry signatures.

7. The system of claim 5, the microprocessor is connected to at least one of the one or more measurement systems.

8. The system of claim 6 where the fabrication parameters comprise at least one of:
   the planarity of a photoresist layer, the depth of a photoresist layer, the chemical composition of a photoresist layer, the width of one or more photoresist features, the slope angles of one or more features in the photoresist layer;
   the planarity of a substantially opaque reticle layer, the chemical composition of a substantially opaque reticle layer, the depth of a substantially opaque reticle layer, the location of one or more features in the substantially opaque reticle layer, the depth of one or more features in the substantially opaque reticule layer, the width of one or more features in the substantially opaque reticle layer, the slope angles of the walls of one or more features in the substantially opaque reticle layer;
   the planarity of a substantially transparent reticle layer, the chemical composition of a substantially transparent reticle layer, the depth of a substantially transparent reticle layer, the location of one or more features in the substantially transparent reticle layer, the depth of one or more features in the substantially transparent reticle layer, the width of one or more features in the substantially transparent reticle layer, the slope angles of the walls of one or more features in the substantially transparent reticle layer and the location of one or more defects in the substantially transparent reticle layer.

9. The system of claim 6, the scatterometry signatures are constructed from at least one of observed intensity/phase signatures, modeling, and simulation.

10. A system for feeding forward reticle fabrication data, comprising:
   means for employing one, or more fabricating components adapted to perform at least one or more reticle fabrication processes;
   means for employing a control system connected to at least one of the one or more fabricating components, the control system adapted to control, at least in part, the operation of at least one of the one or more fabricating components and to map a reticle into a grid pattern consisting of a plurality of grid blocks;
   means for employing one or more measurement components operatively connected to the control system, the one or more measurement components adapted to measure, via scatterometry, one or more reticle fabrication parameters from one or more reticle fabrication processes at one or more grid blocks;

means for employing a signature data store connected to the control system, the signature data store adapted to store one or more scatterometry signatures, each signature containing data for one or more grid blocks; and means for constructing a signature data store from at least one of observing intensity/phase signatures and modeling and simulation intensity/phase results.

* * * * *